(12) United States Patent
Yoshida et al.

(10) Patent No.: US 8,284,527 B2
(45) Date of Patent: Oct. 9, 2012

(54) MAGNETIC HEADS HAVING A GRADED DOMAIN CONTROL FILM AND METHODS OF MANUFACTURE THEREOF

(75) Inventors: Nobuo Yoshida, Hiratsuka (JP); Masato Shiimoto, Odawara (JP); Kenichi Akita, Chigasaki (JP); Kan Yasui, Kodaira (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 129 days.

(21) Appl. No.: 12/957,229

(22) Filed: Nov. 30, 2010

(65) Prior Publication Data
US 2011/0134564 A1 Jun. 9, 2011

(30) Foreign Application Priority Data
Dec. 7, 2009 (JP) ................................. 2009-277518

(51) Int. Cl.
*G11B 5/39* (2006.01)
(52) U.S. Cl. ..................................... 360/324.2
(58) Field of Classification Search ............... 360/324.1, 360/324.11, 324.12, 324.2
See application file for complete search history.

(56) References Cited

U.S. PATENT DOCUMENTS

| | | | | |
|---|---|---|---|---|
| 6,381,107 B1 * | 4/2002 | Redon et al. | ............... | 360/324.2 |
| 6,728,079 B2 * | 4/2004 | Shimazawa | ................... | 360/320 |
| 7,154,713 B2 * | 12/2006 | Watanabe et al. | ............. | 360/313 |
| 7,551,408 B2 * | 6/2009 | Shimazawa et al. | ..... | 360/324.11 |
| 7,733,612 B2 * | 6/2010 | Miyauchi et al. | ........ | 360/324.11 |
| 7,813,086 B2 * | 10/2010 | Tanaka et al. | ............... | 360/324.1 |
| 7,876,535 B2 * | 1/2011 | Machita et al. | ............... | 360/319 |
| 7,933,099 B2 * | 4/2011 | Ohta et al. | .................... | 360/322 |
| 8,009,391 B2 * | 8/2011 | Tanaka et al. | ................. | 360/319 |
| 2004/0042126 A1 * | 3/2004 | Watanabe et al. | ............. | 360/319 |
| 2007/0206333 A1 * | 9/2007 | Watanabe et al. | ............. | 360/313 |
| 2008/0239585 A1 * | 10/2008 | Ousugi et al. | ................. | 360/319 |

OTHER PUBLICATIONS

Klaassen et al., "Broad-Band Noise Spectroscopy of Giant Magnetoresistive Read Heads," IEEE Transactions on Magnetics, vol. 41, No. 7, Jul. 2005, p. 2307-2317.

* cited by examiner

*Primary Examiner* — Angel A. Castro
(74) *Attorney, Agent, or Firm* — Zilka-Kotab, PC

(57) ABSTRACT

A magnetic head, according to one embodiment, includes a sensor film, a sensor cap film provided above the sensor film, a pair of shields including an upper magnetic shield and a lower magnetic shield which serve as electrodes that pass current in a film thickness direction of the sensor film, a track insulating film contacting both sides of the sensor film in the track width direction, a graded domain control film arranged on both sides in the track width direction of the sensor film adjacent the track insulating film, and an element height direction insulating film positioned on an opposite side of the sensor film relative to an air-bearing surface, wherein an edge position of the element height direction insulating film adjacent the sensor film on the air-bearing surface side is substantially the same as an edge position of the sensor cap film in the element height direction.

20 Claims, 26 Drawing Sheets

ABS    C

ABS    C

ABS    C

ABS     C

ABS     C

ABS    C

ABS    C

ABS    C

ABS    C

ABS    C

ABS    C

ABS    C

ABS    C

ABS    C

ABS    C

ABS   C

ABS   C

ABS    C

ABS    C

ABS  C

ABS  C

ABS    C

ABS    C

MAGNETIC HEADS HAVING A GRADED DOMAIN CONTROL FILM AND METHODS OF MANUFACTURE THEREOF

RELATED APPLICATIONS

The present application claims priority to a Japanese Patent Application filed Dec. 7, 2009 under Appl. No. 2009-277518, which is incorporated herein by reference.

FIELD OF THE INVENTION

The present invention relates to a Current-Perpendicular-to-Plane (CPP) magnetoresistive effect head comprising a magnetic reproduction head, and to methods of manufacture thereof.

BACKGROUND OF THE INVENTION

A magnetoresistive effect type magnetic head may be employed as a sensor for reproduction of magnetic information recorded on a magnetic recording medium in high recording density magnetic recording devices, such as a high density hard disk, and is the component that largely governs performance in magnetic recording techniques.

In recent years, magnetic reproduction heads are being employed that use, for example, the magnetoresistive effect of a multilayer film comprised by laminating ferromagnetic metallic layers with non-magnetic intermediate layers therebetween. This is called giant magnetoresistive effect (GMR). For such GMR heads, originally, Current-in-Plane (CIA) type heads were employed, in which the sensor current flows in a parallel fashion within the plane of the sensor film. In order to improve recording density, tunneling magnetoresistive effect (TMR) heads and Current-Perpendicular-to-Plane-Giant Magnetoresistive effect (CPP-GMR) heads have been developed and used, which are beneficial in achieving higher output with reduced track width and reduced gap width, and TMR heads now represent a majority of magnetic reproduction heads being produced. Such TMR heads and CPP-GMR heads are CPP type heads in which the sensor current flows in perpendicular fashion within the sensor film, in contrast to conventional GMR heads.

When the giant magnetoresistive effect and tunneling magnetoresistive effect are employed in a magnetoresistive element, a structure called a spin valve may be used. A spin valve typically has a laminated structure comprising an antiferromagnetic layer/ferromagnetic layer/non-magnetic intermediate layer/ferromagnetic layer. The magnetization of the ferromagnetic layer that is in contact with the antiferromagnetic layer is substantially fixed by the exchange coupling magnetic field generated at the antiferromagnetic layer/ferromagnetic layer interface. Output is obtained by free rotation of the magnetization of the other ferromagnetic layer by an external magnetic field. The ferromagnetic layer whose magnetization is substantially fixed by the antiferromagnetic layer is called the fixed layer, while the ferromagnetic layer whose magnetization is rotated by an external magnetic field is called the free layer. The reproduction output is generated as the product of the utilization rate with the magnetoresistive (MR) ratio, which is the rate of change of resistance produced by the drive voltage and the magnetoresistive effect. The utilization rate is an index indicating to what extent the free layer magnetization is rotated by the magnetic field applied from the magnetic recording medium. A high utilization rate means high output; but, if the utilization rate is too high, the change in resistance with respect to the magnetic field becomes non-linear, with the result being that performance of the magnetic recording/reproduction device is adversely affected. Usually, for this reason, a utilization rate of about 20% to 30% is set. Typically, the magnitude of the utilization rate is appropriately controlled by optimizing, for example, the material of the domain control layer provided on both sides of the track direction of the multilayer film of the magnetoresistive effect head, and/or the film thickness.

Typically the MR ratio is raised in order to increase the reproduction output, which largely governs the performance of the magnetoresistive effect head. TMR heads, as referred to above, are currently widely employed, in order to achieve the highest possible MR ratio.

Another factor that largely governs the performance of the magnetoresistive head is noise. Noise may include, for example, Barkhausen noise, that is generated by the domains in the free layer, and Johnson noise or shot noise that is caused by resistance. Barkhausen noise is noise that is generated due to the fact that the free layer magnetization possesses domains; thus, the Barkhausen noise can be suppressed by preventing generation of domains in the free layer by providing a domain control layer in the magnetoresistive effect head. Johnson noise or shot noise is dependent on resistance, so reduction of the head resistance is an effective means of reducing such noise. Magnetoresistive effect films having a high MR ratio and low magnetoresistance are currently being developed based on these concepts.

A sensor film requires processing by, for example, etching to define the element height direction and track width direction. In the case of the element height direction, increased fineness may be achieved by final mechanical processing; however, in the case of the track width direction, increased fineness must be achieved in the wafer step. For track width processing, a photolithographic technique or the like is employed, and due to the nature of this technique, it is desirable to perform processing on a planar face.

Chemical Mechanical Polishing (CMP) in the semiconductor field was developed with this end in view. Specifically, formation of a pattern of maximum fineness in the magnetic head takes place in this track width forming step and is preferably performed on a planar face. Consequently, as the processing of the sensor film in the wafer step, processing is desirably performed from the track width direction rather than the element height direction. However, in the ordinary manufacturing method, certain problems arise. This is because the hard bias film that is arranged at both ends in the track width direction of the sensor film is subjected to cutting processing in the same way as by processing in the element height direction. In this case, the volume of the hard bias film in the final slider condition depends on the dimension of the sensor film in the element height direction. Specifically, since fineness in the element height direction is being increased in the same way as increased fineness of the track width, only a dimension of the order of a few tens of nanometers (nm) will be left in the case of the element height direction also. In this case, regarding the element characteristics, possible diminution of the domain control effect due to the hard bias film may be a problem. This is because, in the case of magnetic films, such as hard bias films, magnetic stability is best guaranteed by a large volume; therefore, as the fineness is increased in the element height direction, the magnetic stability of the hard bias film itself is lowered, with the result that domain controllability is lowered. In the worst case, this may give rise to problems regarding generation of Barkhausen noise, etc.

In addition, severe effects may arise from other factors. Among these is the effect on the magnetic head SNR of noise (magnetic noise) produced by thermal fluctuations of free layer magnetization. While there has been an outstanding increase in the MR ratio in recent years in, for example, TMR heads, the accompanying improvement in the head SNR is saturated at a certain level. This is because, when the reproduction output is increased, the magnetic noise also increases proportionally, and the head SNR becomes saturated at a certain maximum value. In recent years, increase in fineness in the track width and element height direction has proceeded to the extent of the order of a few tens of nanometers, but, owing to the increased thermal effect, the problem of magnetic noise has become severe. Consequently, it is considered vital to reduce this magnetic noise in order to improve the head SNR as track fineness is increased in the future.

SUMMARY OF THE INVENTION

A magnetic head, according to one embodiment, includes a sensor film, a sensor cap film provided above the sensor film, a pair of shields including an upper magnetic shield and a lower magnetic shield which serve as electrodes that pass current in a film thickness direction of the sensor film, a track insulating film contacting both sides of the sensor film in the track width direction, a domain control film arranged on both sides in the track width direction of the sensor film adjacent the track insulating film, and an element height direction insulating film positioned on an opposite side of the sensor film relative to an air-bearing surface. An edge position of the element height direction insulating film adjacent the sensor film on the air-bearing surface side is substantially the same as an edge position of the sensor cap film in the element height direction, the domain control film is graded such that a film thickness of the domain control film progressively decreases from an inner side in the element height direction toward the air-bearing surface direction, and a position at which the film thickness of the domain control film starts to change is substantially the same as the edge position of the element height direction insulating film on the air-bearing surface side thereof.

In another embodiment, a magnetic head includes a sensor film having a fixed layer whose magnetization direction is fixed, an intermediate layer, and a free layer having a magnetization direction that changes in response to an external magnetic field, a sensor cap film above the sensor film, a pair of shields including an upper magnetic shield and a lower magnetic shield which serve as electrodes that pass current in a film thickness direction of the sensor film, a track insulating film adjacent both sides of the sensor film in the track width direction, a domain control film arranged on both sides in the track width direction of the sensor film adjacent the track insulating film, a domain control cap film above the domain control film, and an element height direction insulating film arranged in a portion on an opposite side to an air-bearing surface of the sensor film. An edge position of the element height direction insulating film adjacent the sensor film on the air-bearing surface side is substantially the same as an edge position of the sensor cap film in the element height direction, the domain control cap film is graded such that a film thickness of the domain control cap film progressively decreases from an inner side in the element height direction toward the air-bearing surface direction, and a position at which the film thickness of the domain control cap film starts to change or an edge position of the domain control cap film in the element height direction is substantially the same as the edge position of the element height direction insulating film on the air-bearing surface side.

According to another embodiment, a method of manufacturing a magnetic head includes laminating and forming a sensor film, laminating and forming a sensor cap film above the sensor film, etching the sensor film and the sensor cap film to leave a desired width in a track width direction, forming a track insulating film at an etching edge of the sensor film and the sensor cap film, forming a domain control film above the track insulating film, etching the sensor film to a dimension in an element height direction, arranging an element height direction insulating film at the etching edge of the sensor film in the element height direction, graded etching a top of the domain control film using the element height direction insulating film as an etching mask, and forming an upper magnetic shield. The sensor film includes a fixed layer whose magnetization direction is fixed, an intermediate layer, and a free layer having a magnetization direction that changes in response to an external magnetic field.

Any of these embodiments may be implemented in a magnetic data storage system such as a disk drive system, which may include a magnetic head, a drive mechanism for passing a magnetic storage medium (e.g., hard disk) over the head, and a control unit electrically coupled to the head for controlling operation of the head.

Other aspects and advantages of the present invention will become apparent from the following detailed description, which, when taken in conjunction with the drawings, illustrate by way of example the principles of the invention.

DETAILED DESCRIPTION

Figure 1:
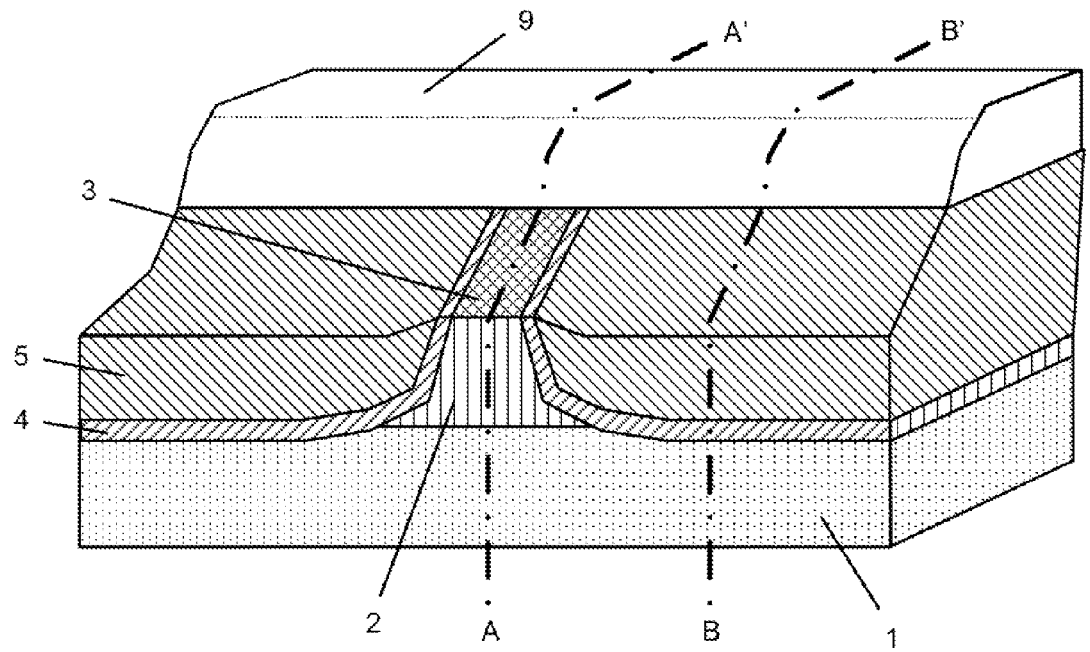
FIG. 1 is a perspective view showing a reproduction head, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Magnetic noise has two chief characteristics. Firstly, it is inversely proportional to the square root of the free layer volume, and secondly, it is proportional to the reproduction output. The first characteristic implies that the magnetic sensor becomes smaller with an increase in recording density, e.g., as the free layer volume becomes smaller, magnetic noise is substantially increased. The second characteristic implies that, since the magnetic noise also increases proportionally when the reproduction output is increased, the head SNR will become saturated at a certain maximum value. Consequently, in order to solve these problems, suppressing the increase in magnetic noise produced by reduced free layer volume accompanying increased recording density and to decrease the magnetic noise without lowering reproduction output is useful. Domain control, as referred to above, is one method to accomplish this reduction in magnetic noise.

Reproduction output is generated by magnetic rotation of the free layer, most reproduction output being generated by the region of the free layer in the vicinity of the air-bearing surface. This is because of the larger magnetic signal from the medium in the vicinity of the air-bearing surface. In contrast, magnetic noise appears to be generated to the same degree from substantially the entire free layer. This means that the relative relationship between the reproduction output and the magnetic noise is not uniform in the element height direction but rather the magnetic noise ratio is relatively increased going in the direction of the interior of the element, from the air-bearing surface. Domain control, as referred to above, is effective in reducing this magnetic noise. However, if the overall domain control is made too strict, the reproduction output is lowered. In order to resolve this dilemma, consideration has been given to the possibility of reducing the magnetic noise component to an extent, increasing relatively towards the direction of the element interior, by gradually increasing the strictness of domain control towards the interior in the direction of the element height, compared with the vicinity of the air-bearing surface.

However, regulation of domain control is difficult to achieve and difficulties arise in implementing this concept in a precise fashion. This is because domain controllability in the sensor film varies depending, in particular, on the distance between the free layer and the domain control film and/or the film thickness of the domain control film, so it is difficult to manufacture a sensor film in which these factors are satisfactorily controlled.

According to one embodiment, preventing the lowering of reproduction output in a Current-Perpendicular-to-Plane (CPP) type magnetoresistive effect head and reducing magnetic noise may be accomplished. Furthermore, methods of producing a magnetic head having this beneficial effect in a stable fashion is also described.

According to one embodiment, the problem of lowering of the head signal-to-noise ratio (SNR) due to increased magnetic noise accompanying an increase in reproduction output and increased fineness of the magnetoresistive effect film in the CPP type magnetoresistive effect head is solved, and a head capable of achieving higher recording density may be implemented in a stable fashion.

A CPP type magnetoresistive effect head, according to one embodiment, includes a sensor film, a sensor cap film provided above the sensor film, a pair of shields including an upper magnetic shield and a lower magnetic shield which serve as electrodes that pass current in a film thickness direction of the sensor film, a track insulating film contacting both sides of the sensor film in the track width direction, a domain control film arranged on both sides in the track width direction of the sensor film adjacent the track insulating film, and an element height direction insulating film positioned on an opposite side of the sensor film relative to an air-bearing surface. In addition, it has the following characteristics.

An edge position of the element height direction insulating film adjacent the sensor film on the air-bearing surface side is substantially the same as an edge position of the sensor cap film in the element height direction, the domain control film is graded such that a film thickness of the domain control film progressively decreases from an inner side in the element height direction toward the air-bearing surface direction, and a position at which the film thickness of the domain control film starts to change is substantially the same as the edge position of the element height direction insulating film on the air-bearing surface side thereof.

In one embodiment where a layer structure is provided in which a domain control cap film is positioned above the domain control film, the domain control cap film has a graded film thickness such that its film thickness progressively decreases from the inner side in the element height direction towards the air-bearing surface direction and the position at which this film thickness starts to change or the edge position of the domain control cap film in the element height direction is substantially the same as the edge position of the element height direction insulating film on the air-bearing surface side.

It is also possible to make the film thickness of the sensor cap film graded towards the direction of the air-bearing surface, according to one embodiment. In this case, the cap film thickness decreases as the vicinity of the air-bearing surface is approached. By grading the sensor cap film thickness in the element height direction, the separation of the magnetic fields at the air-bearing surface becomes smaller than the separation of the magnetic shields in the direction of the element interior. Also, although the sensor cap film or domain control cap film diminishes in film thickness towards the air-bearing surface direction, it is also possible for the residual film thickness thereof to approach zero at the air-bearing surface.

In another embodiment, a method of producing a magnetic head includes laminating and forming a sensor film. The sensor film may include a fixed layer whose magnetization direction is fixed, an intermediate layer, and a free layer having a magnetization direction that changes in response to an external magnetic field. The method also includes laminating and forming a sensor cap film above the sensor film, etching the sensor film and the sensor cap film to leave a desired width in a track width direction, forming a track insulating film at an etching edge of the sensor film and the sensor cap film, forming a domain control film above the track insulating film, etching the sensor film to a dimension in an element height direction, arranging an element height direction insulating film at the etching edge of the sensor film in the element height direction, graded etching a top of the domain control film using the element height direction insulating film as an etching mask, and forming an upper magnetic shield. When forming the element height direction insulating film, in one embodiment, an etching protective film may be additionally formed on the insulating film.

The dimension of the CPP type magnetoresistive effect head in the element height direction is defined by the sensor film and the edge of the sensor cap film that is integrally formed with the sensor film and the edge of the insulating film in the element height direction coincide, according to one embodiment. Also, the position at which the film thickness of the domain control film starts to change is defined by this element height direction insulating film. Consequently, the position where the film thickness of the sensor film and the domain control film start to change, constituting the reference position in the element height direction, can be defined by self-alignment, making it possible to ensure high-precision position control. Also, even if the thickness of the sensor cap film is graded, self-alignment can be achieved in the same way along with the position at which the film thickness of the domain control film starts to change. Thus, high-precision position control can be achieved in the method.

With any of the embodiments described above, beneficial effects may be achieved that, while domain control characteristics with respect to the sensor film on the side of the air-bearing surface are relaxed, domain control characteristics with respect to the element height direction from the air-bearing surface are strict and a construction of a high degree of precision may be achieved. Embodiments presented herein provide the ability to prevent the lowering of the reproduction output of a CPP type magnetoresistive effect head and beneficial effects of a reduction in magnetic noise may be achieved in a stable fashion.

According to one approach, in a CPP type magnetoresistive effect head, lowering of reproduction output may be prevented, even in the case of narrow track width, and magnetic noise reduction can be implemented. Thus, the head SNR may be improved and high recording density may be achieved.

Various embodiments are described below with reference to the figures. Usually, the CPP type magnetoresistive effect head is employed as a reproduction head, sometimes being employed in combination with a recording head, but is not so limited. In the following description, unless specially noted, the recording head portion is omitted and only the reproduction head portion is described.

FIG. 1 is a perspective view showing a reproduction head according to one embodiment, in which the vicinity of the sensor film is seen from the air-bearing surface. A lower magnetic shield 1, sensor film 2, sensor cap film 3, track insulating film 4, domain control film 5, and element height direction insulating film 9 are shown. The upper magnetic shield and the magnetic gap film and other items that are arranged below the upper magnetic shield are omitted from FIG. 1. It should be noted that the sensor film 2 is a multilayer film, comprising at least a free layer, fixed layer and intermediate layer between the free layer and fixed layer. A hard magnetic film is employed as the domain control film 5 and is used to apply a magnetic field in the track width direction to the sensor film 2 in operation to stabilize the properties of the free layer. The domain control film 5 and sensor cap film 3 have a shape that is gradually reduced in film thickness towards the air-bearing surface, from a position at the edge of the insulating film 9 in the element height direction on the side of the air-bearing surface.

Figure 2A:
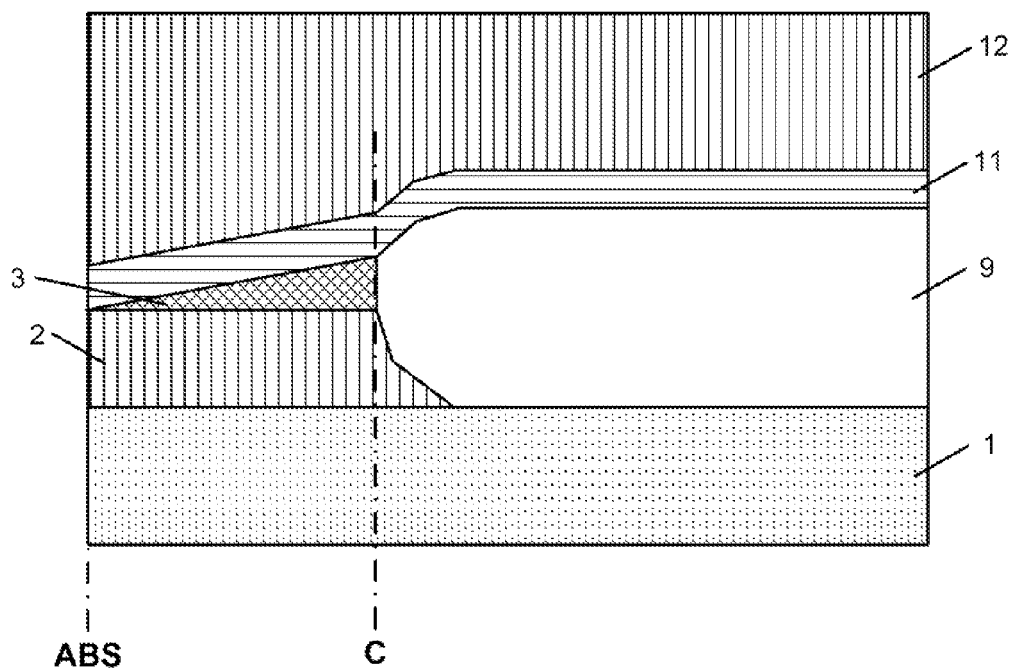
FIG. 2A is a cross-sectional view showing a reproduction head, according to one embodiment.
Figure 2B:
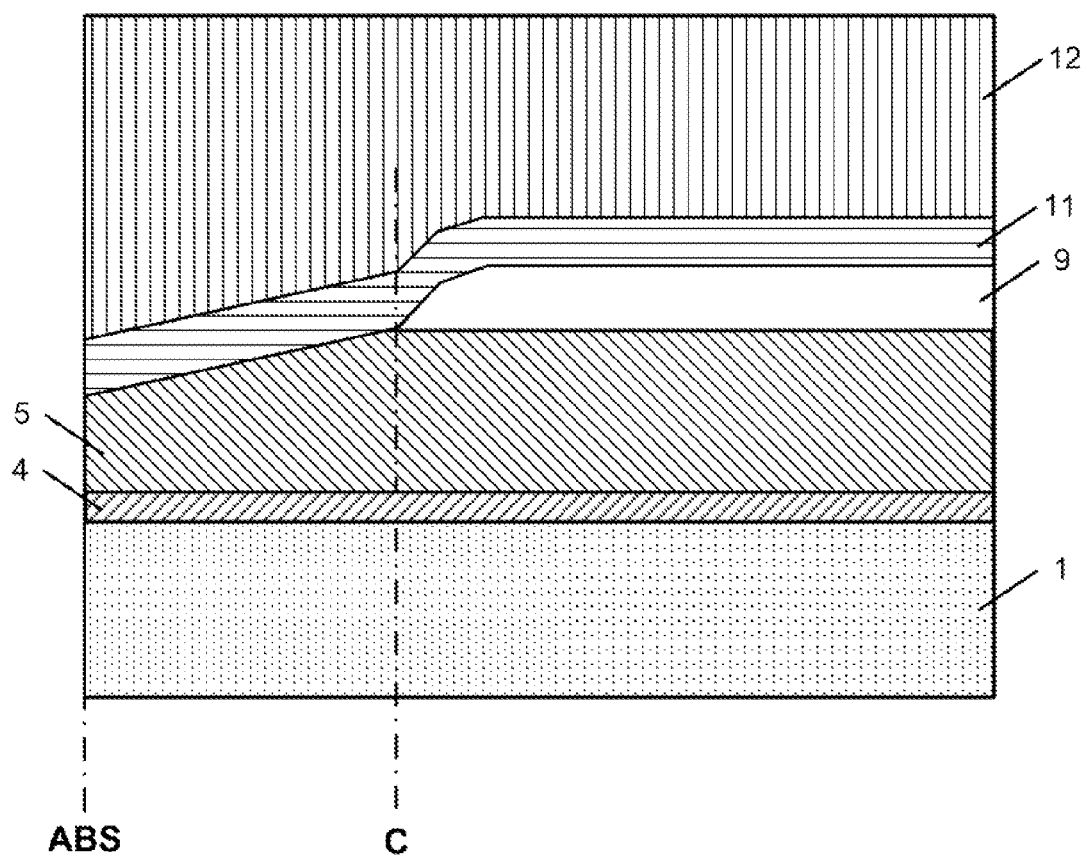
FIG. 2B is a cross-sectional view showing a reproduction head, according to one embodiment.
Figure 28:
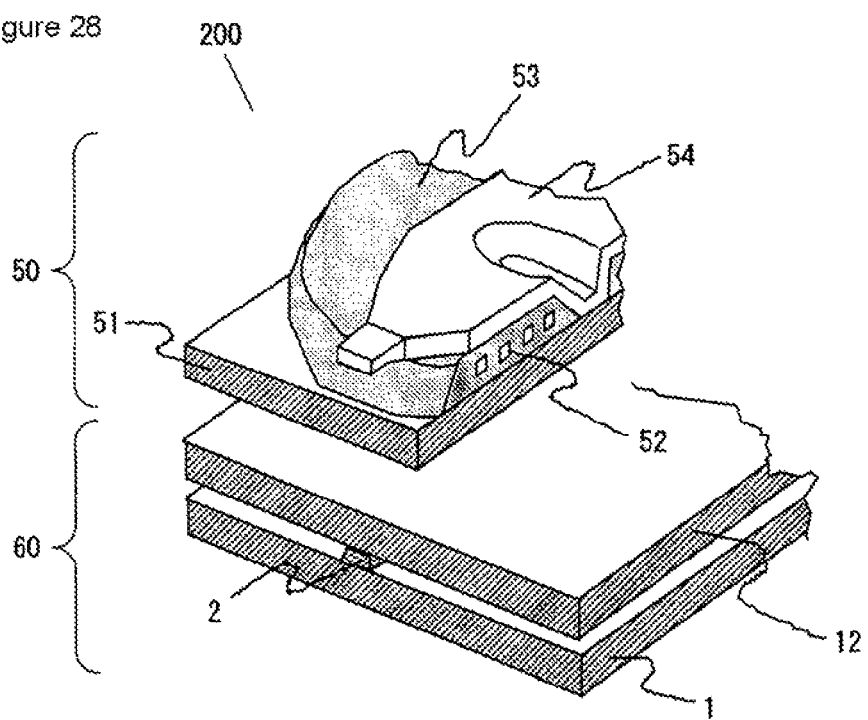
FIG. 28 is a view showing an example construction of a recording/reproduction separated type magnetic head for perpendicular recording, according to one embodiment.

This structure is shown in further detail with reference to FIG. 2A and FIG. 2B. FIG. 2A is a view showing a cross-section along the line A-A' of the middle of the track width in FIG. 1 and FIG. 2B is a view showing a cross-section along B-B' of the region outside the track. It should be noted that the left side in the figure shows the air-bearing surface (ABS). Moving toward the right side in the figures corresponds to going toward the element interior in the element height direction. FIG. 2A and FIG. 28 also illustrate the upper magnetic film 11 and upper magnetic shield 12. It should be noted that the upper magnetic gap film 11 is a non-magnetic conductive film, which may comprise any suitable material as known in the art, such as Cr, Ru, Ta, Ti, Rh, etc., being provided as a single film, mixed film, laminated film, etc.

In FIG. 2A, the position of the edge of the insulating film 9 in the element height direction on the side of the air-bearing surface is substantially the same as the position of the edge of the sensor cap film 3 in the element height direction. In the case of the sensor cap film 3 also, the film thickness shows a gradient in the direction of the air-bearing surface. The film thickness decreases as the proximity of the air-bearing surface is approached. Also, in FIG. 2B, the domain control film 5 that is arranged on both sides of the sensor film 2 in the track width direction has a film thickness showing a gradient, such that the film thickness becomes progressively less in the air-bearing surface direction, from the side of the interior of the element. The position at which this film thickness starts to change is substantially the same as the position of the edge of the sensor cap film 3 in the element height direction (position of the edge of the insulating film 9 in the element height direction on the side of the air-bearing surface). In other words, all of the position of the edge of the insulating film 9 in the element height direction on the side of the air-bearing surface, the position of the edge of the sensor cap film 3 in the element height direction, and the position at which the film thickness of the domain control film 5 starts to change are substantially the same as the C position shown in the figures. In this way, by making the position at which the film thickness of the film having a gradient starts to change the same as the position of the edge of the sensor cap film 3 in the element height direction, domain control magnetic fields of different magnitudes in the inwards direction of the sensor film 2 in the element height direction and in the direction of the face opposite to the medium may be efficiently applied with progressively changing, i.e. graded, magnitudes.

Figure 3:
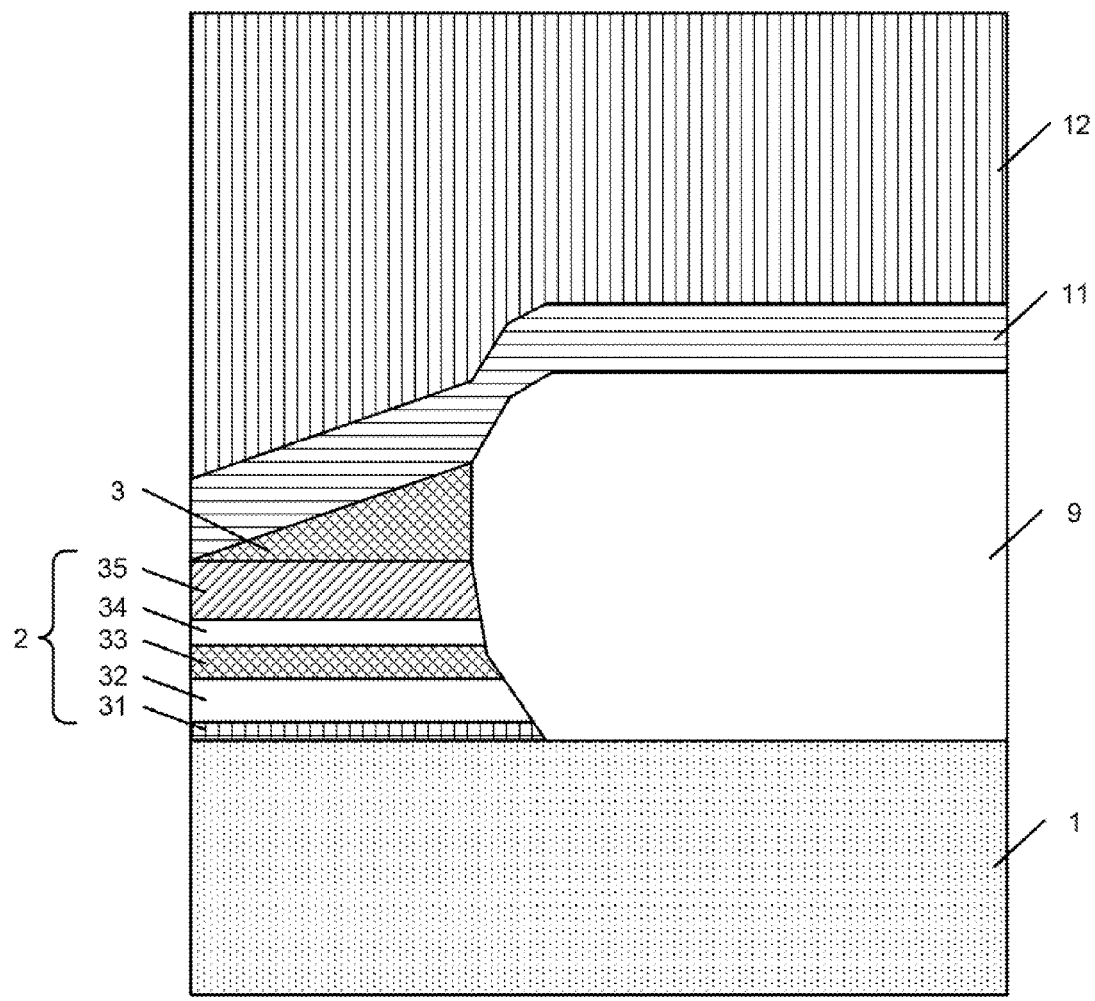
FIG. 3 is a view showing the shape of the cross-section in the vicinity of the sensor film, according to one embodiment.

FIG. 3 is a view to a larger scale of the vicinity of the sensor film of FIG. 2A, according to one embodiment. In the illustrated embodiment, the sensor film 2 comprises a sensor under-layer 31, an antiferromagnetic layer 32, a fixed layer 33, an intermediate layer 34 and a free layer 35. In the case of an MgO-TMR sensor film, the intermediate layer 34 may comprise an MgO barrier.

Figure 4:
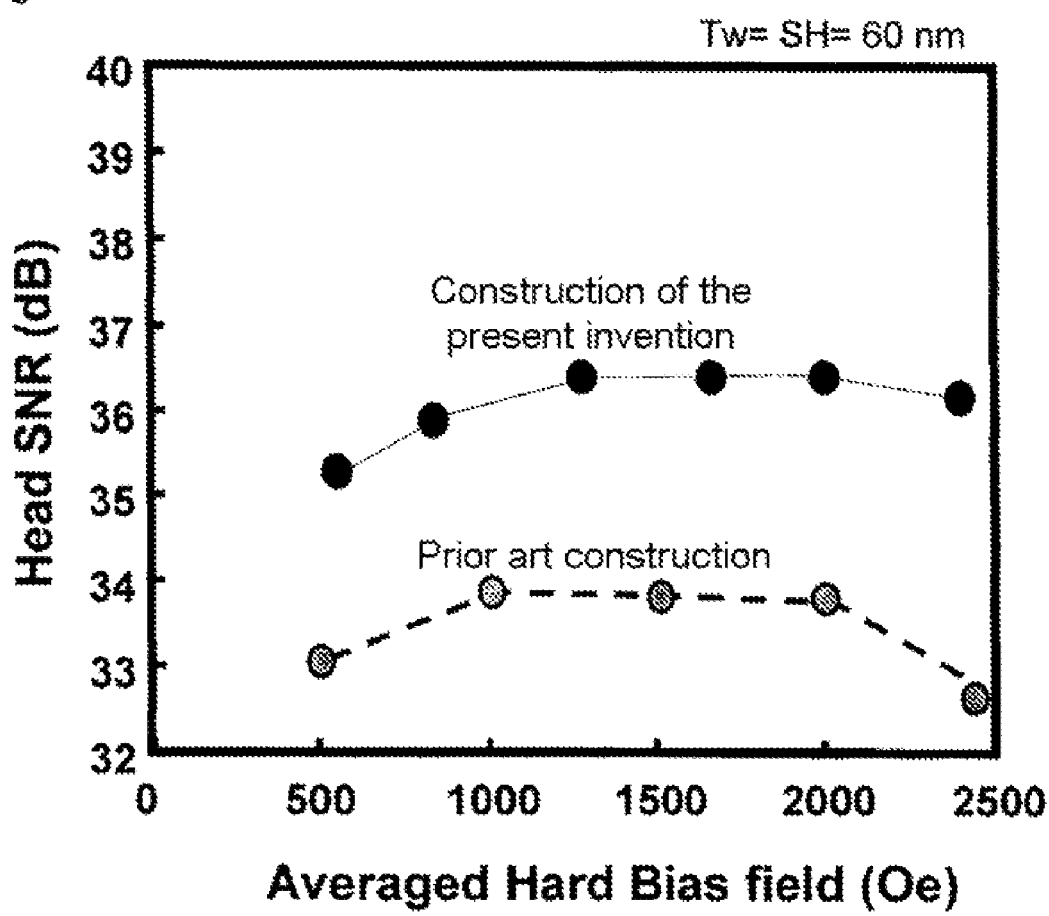
FIG. 4 is a view showing the relationship between the head performance and the domain control magnetic field in the construction, according to one embodiment, and a prior art construction.

As described above, the lowering of the head SNR produced by magnetic noise increasing with an increase in the reproduction output can be prevented by giving the domain control film 5 and sensor cap film 3 a film thickness gradient such that the film thickness progressively decreases in the element height direction from the side of the element interior towards the direction of the air-bearing surface, according to one embodiment. FIG. 4 shows an example of the results of modeling the effect of one embodiment by magnetic field calculation. The horizontal axis shows the value obtained by averaging, in the element height direction, the domain control magnetic field applied by the domain control film in the middle of the sensor film in the track width direction and the horizontal axis shows the value of the head SNR under these circumstances. The conventional construction is a construction in which the domain control magnetic field in the element height direction is substantially uniform, at about 1000 to 11,000 Oe. The domain control magnetic field of the head construction, according to one embodiment, has a distribution increasing as the interior of the element is approached, being about 500 Oe in the vicinity of the air-bearing surface and about 3000 Oe in the interior in the element height direction. As shown in FIG. 4, the head SNR of the construction, according to one embodiment, is improved by about 2 dB to 3 dB compared with the conventional construction. Also, since, in FIG. 1 and FIG. 2A, the sensor cap film 3 decreases in thickness as the air-bearing surface is approached, at the air-bearing surface, the distance between the upper and lower magnetic shields can be made small, making it possible to obtain a resolution improvement effect.

In addition, one embodiment provides a construction and method of manufacture for obtaining the effect of improving the head SNR referred to above in stable fashion. For example, if pattern exposure processing and etching processing are carried out on their own in order to alter the film thickness of the domain control film without employing the present invention, alignment error of the pattern is inescapably generated. This alignment error is about ±15 to 20 nm. The effect of this alignment error will be described with reference to FIG. 5.

Figure 5:
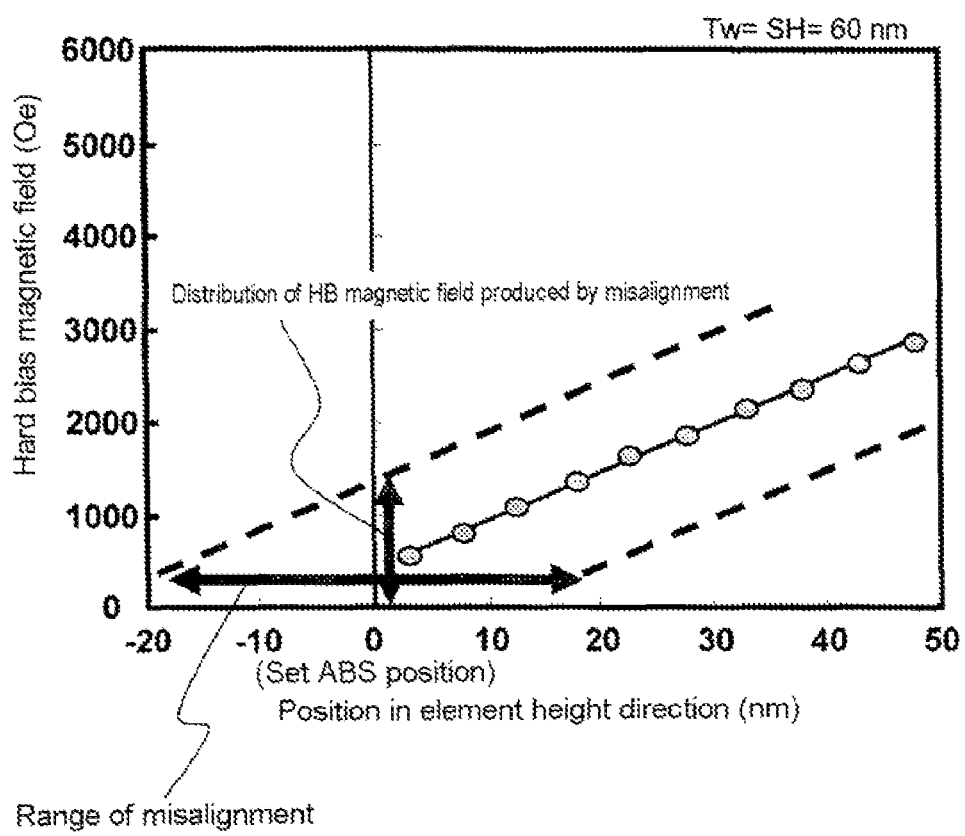
FIG. 5 is a view showing the distribution of the domain control magnetic field and the effect produced by misalignment.

The horizontal axis in FIG. 5 is the position in the element height direction, and the vertical axis shows the domain control magnetic field at each element height position. The continuous line shows the distribution of the graded domain control magnetic field described with reference to FIG. 4, in the vicinity of the air-bearing surface, the domain control magnetic field is about 500 Oe, and is about 3000 Oe in the interior in the element height direction. If the pattern is shifted by about ±20 nm by alignment error, variation of the hard bias magnetic field at the set air-bearing surface (zero position on the horizontal axis) is produced in a range from the region where the magnetic field decreases fairly abruptly from 500 Oe to about 1500 Oe. As a result, variation is produced also in the average value of the average domain control magnetic field.

Figure 6:
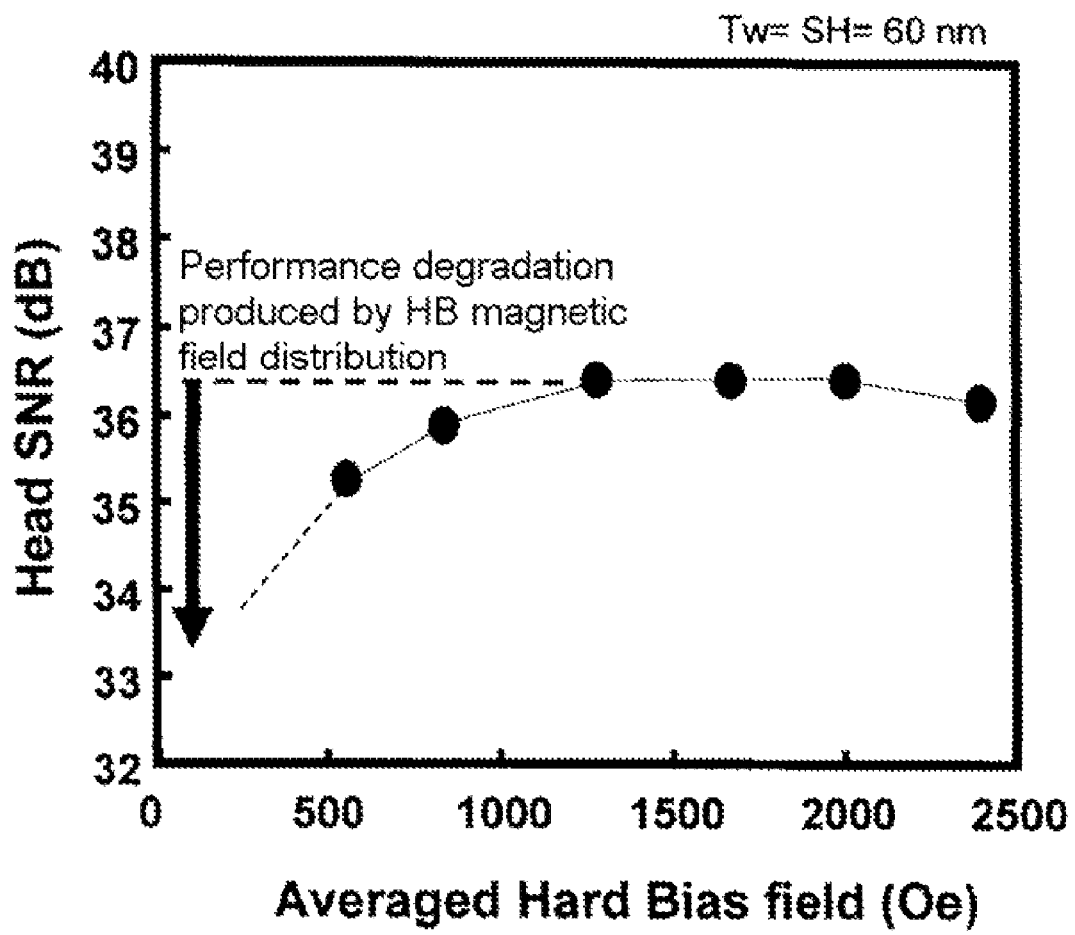
FIG. 6 is a view given in explanation of the degradation of head performance produced by variability of the domain control magnetic field.

For example, in FIG. 5, if it is assumed that misalignment occurs on the plus side in the element height direction, the average domain control magnetic field is degraded and the domain control magnetic field has scarcely any effect in the vicinity of the air-bearing surface. As a result, lowering of the head SNR is produced as shown in FIG. 6. Conversely, if misalignment occurs on the minus side in the element height direction, the average domain control magnetic field is increased, tending to make degradation of the head SNR less likely, but the distance between the upper and lower magnetic shields is increased. As a result, degradation of the resolution is produced. This presents an obstacle to increasing recording density.

One embodiment prevents such inconveniences. In the head construction according to embodiments shown in FIG. 1, FIG. 2A and FIG. 2B, all of the position of the edge of the insulating film 9 in the element height direction on the side of the air-bearing surface, the position of the edge of the sensor cap film 3 in the element height direction going inwards, and the position at which, the film thickness of the domain control film 5 starts to change are substantially the same as the C position shown in the figures. In other words, since what determines the dimension of the CPP type magnetoresistive effect head in the element height direction is the sensor film, the position of the edge of the sensor cap film 3 in the element height direction going inwards, and the position at which the film thickness of the domain control film 5 starts to change are self-aligned. Consequently, alignment error as referred to above is not produced. Also, since the construction is a construction that is produced by a self-aligning process, it has the advantage that inspection for precision of alignment can be dispensed with.

An example of a method of manufacture for obtaining a head construction according to one embodiment is described with reference to FIGS. 7A to 13B. These are diagrams of the manufacturing step of a reproduction head having the construction shown in FIG. 1, FIG. 2A and FIG. 2B. FIG. 7A to FIG. 13A are cross-sectional views along the line A-A' in FIG. 1, and FIG. 7B to FIG. 13B are cross-sectional views along the line B-B' in FIG. 1. Also, a plan view in each step is shown in FIGS. 21 to 27.

Figure 7A:
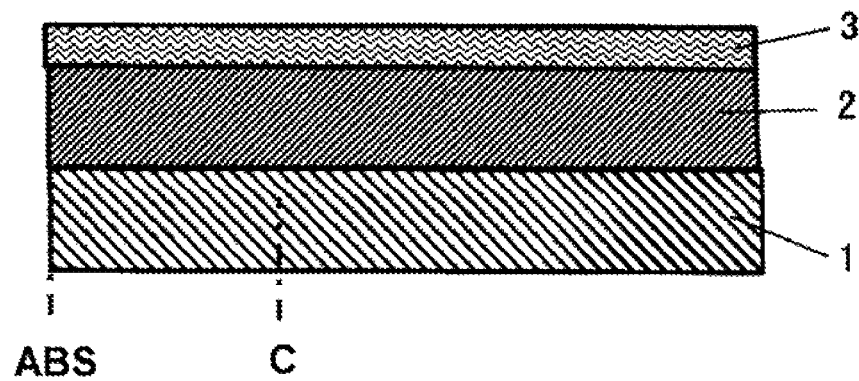
FIG. 7A is a cross-sectional view showing one step in the manufacture of a reproduction head, according to one embodiment.
Figure 7B:
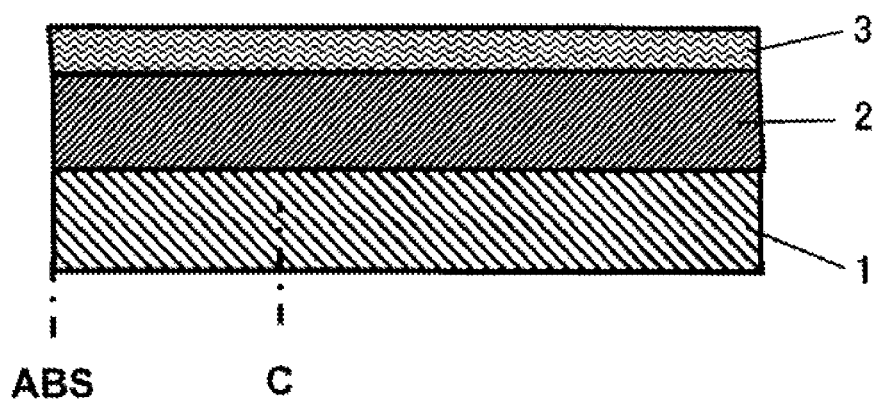
FIG. 7B is a cross-sectional view showing one step in the manufacture of a reproduction head, according to one embodiment.
Figure 21:
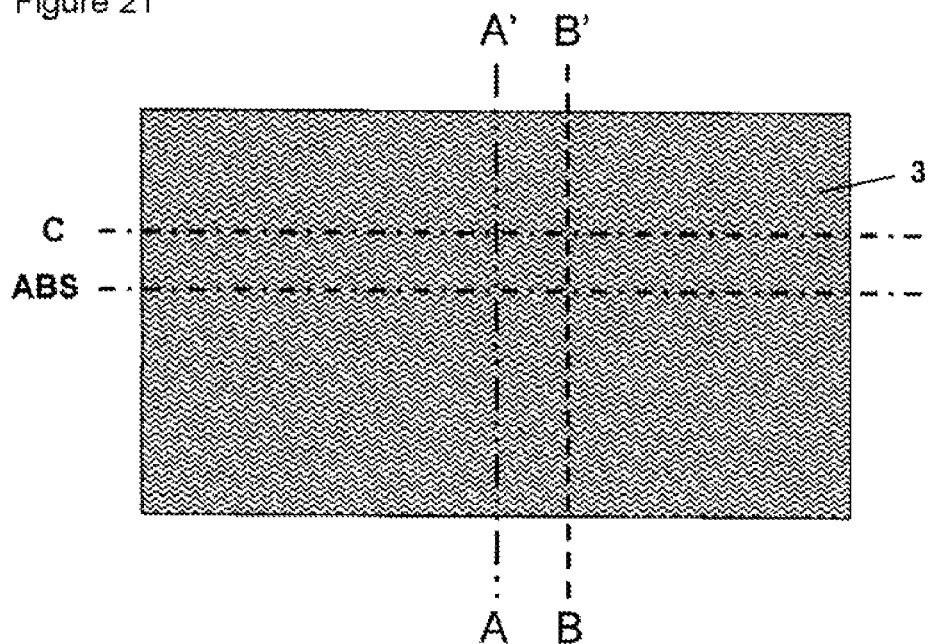
FIG. 21 is a plan view showing a step of manufacturing a reproduction head, according to one embodiment.

First of all, as shown in FIG. 7A and FIG. 7B, a sensor film 2 and a sensor cap film 3 are formed on the lower magnetic shield 1. FIG. 21 is a plan view at this stage, according to one embodiment. The sensor film 2 is a multilayer film, comprising at least a free layer, fixed layer, and an intermediate layer between the free layer and fixed layer. The sensor cap film 3 can be a single layer film or a multilayer film. For example, it could be a metal film of for example Ru, Ta, W, Ti, Ir, Rh, Cu or Cr, or an oxide film of these, or DLC (Diamond Like Carbon), or $Al_2O_3$ or $SiO_2$ or the like could be employed. The sensor cap film 3 could be an insulating film. However, if an insulating film such as an oxide film is employed, it is necessary to arrange the metallic film below the insulating film and to remove the insulating film portion by etching, prior to forming the upper magnetic gap film 11 or upper magnetic shield.

Figure 8A:
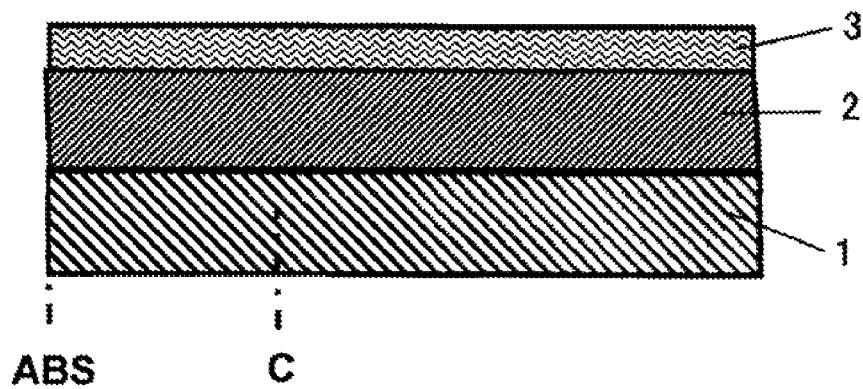
FIG. 8A is a cross-sectional view showing one step in the manufacture of a reproduction head, according to one embodiment.
Figure 8B:
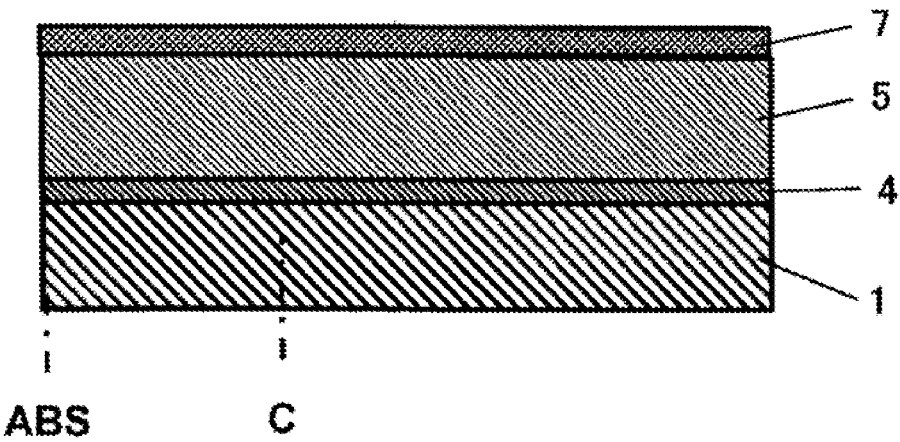
FIG. 8B is a cross-sectional view showing one step in the manufacture of a reproduction head, according to one embodiment.
Figure 22:
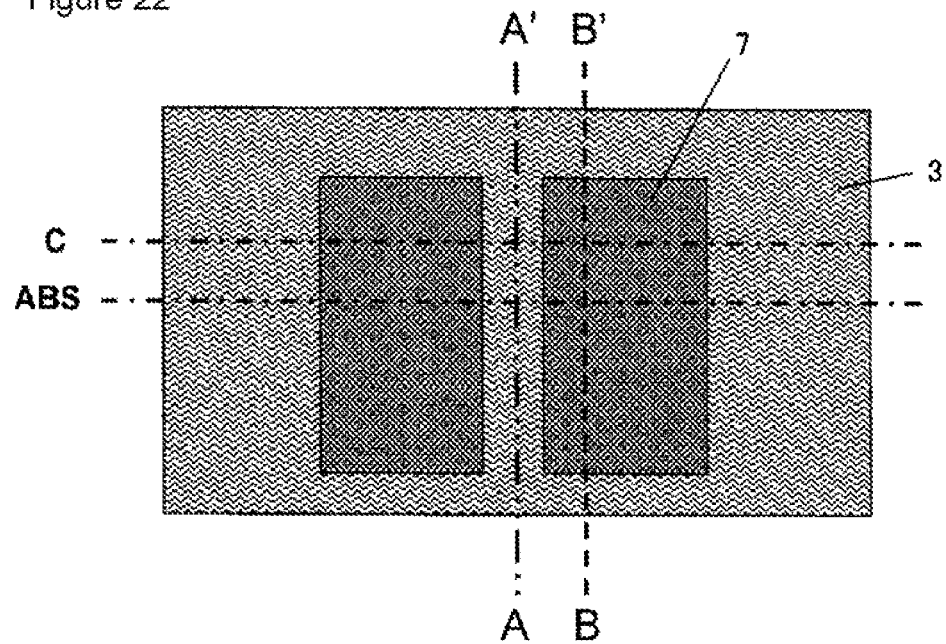
FIG. 22 is a plan view showing a step of manufacturing a reproduction-head, according to one embodiment.

FIG. 8A and FIG. 8B show a condition in which processing is performed to define the track width in the sensor film 2 and sensor cap film 3 and in which a track insulating film 4, domain control film 5 and etching suppression layer 7 are formed. FIG. 22 shows a plan view at this point. Since, in this step, processing is only performed at the edges of the track, the middle of the track (FIG. 8A) is unchanged. When performing processing to define the track width, this region is substantially planar, so adverse effects on the photolithography can be kept to a minimum. Consequently, track width formation for which processing of maximum fineness is required in the wafer step can be performed in stable fashion. It should be noted that, although, in this case, no cap film of the domain control film was provided on the domain control film 5, such a cap film could be provided. Also, although an etching suppression layer 7 was provided, this could also be dispensed with.

As the track insulating film 4, an insulating film made of $Al_2O_3$, $SiO_2$ or AlN or the like could be provided, or a multilayer film of these could be employed. The domain control film 5 may be constituted of a hard magnetic film such as CoPt and a multilayer film employing for example Ti, Cr, CrTi or CrMo as an under-layer film thereof. In some cases, the domain control film may be constituted by repeatedly laminating an under-layer film and hard magnetic film. The etching suppression layer 7 may be constituted by for example a film of a metal such as Ru, Ta, W, Ti, Ir or Rh and/or oxides thereof, a single-layer film of DLC, $Al_2O_3$, $SiO_2$, AlN or SiC, or a laminated film thereof. In this case, a DLC single-layer film is provided as an etching suppression layer 7.

Figure 9A:
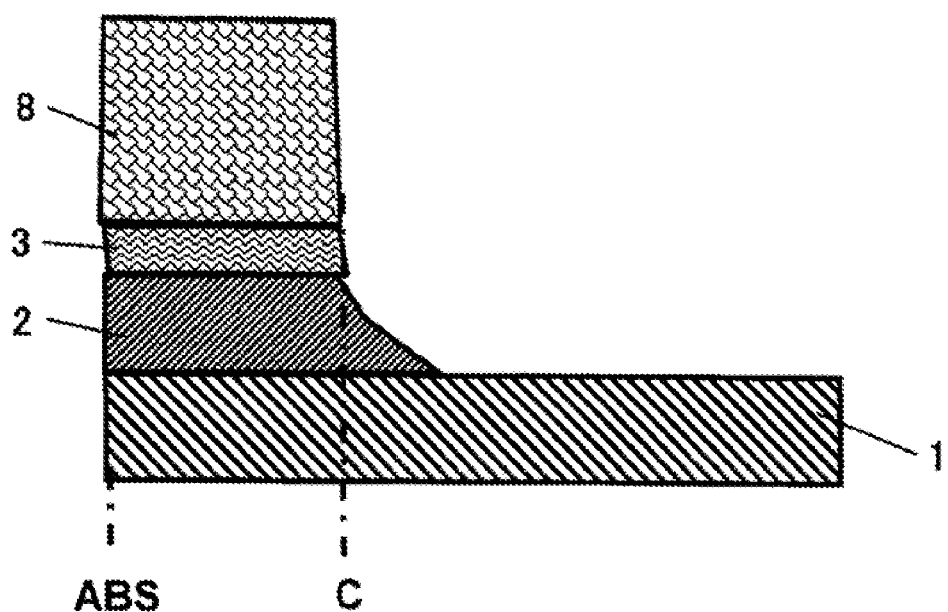
FIG. 9A is a cross-sectional view showing one step in the manufacture of a reproduction head, according to one embodiment.
Figure 9B:
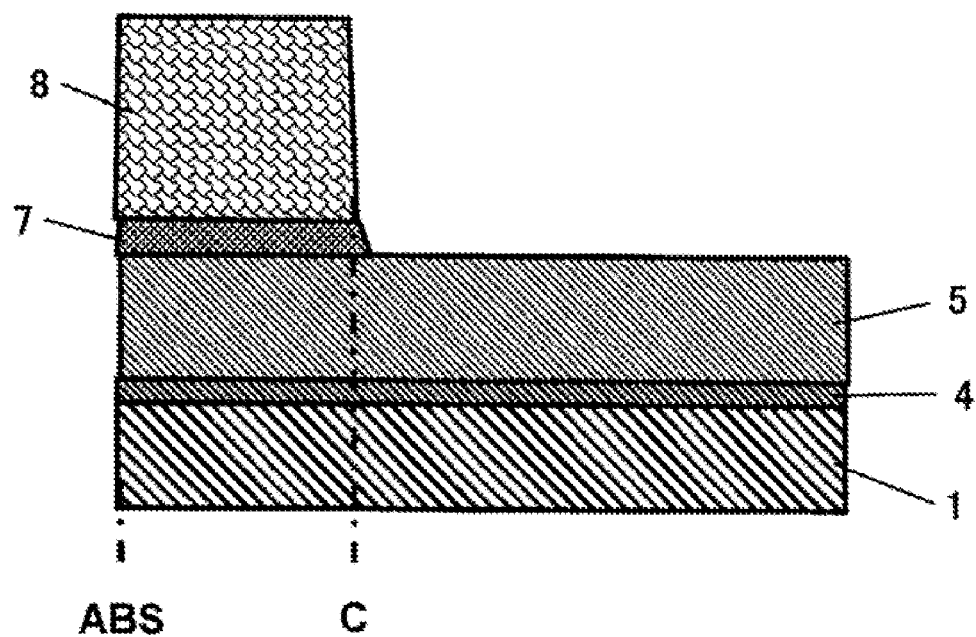
FIG. 9B is a cross-sectional view showing one step in the manufacture of a reproduction head, according to one embodiment.
Figure 23:
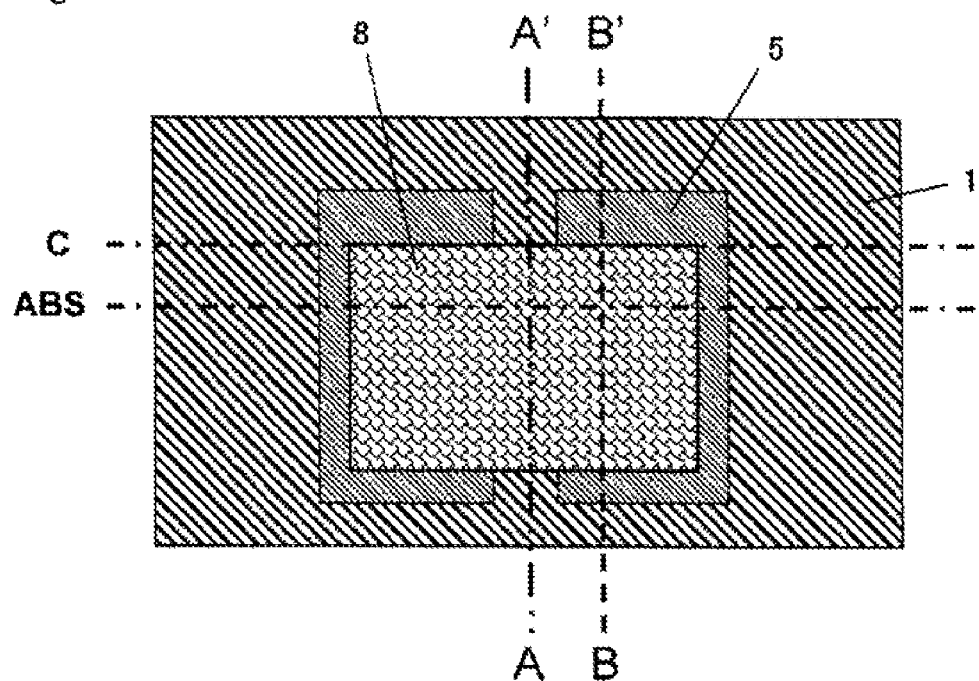
FIG. 23 is a plan view showing a step of manufacturing a reproduction head, according to one embodiment.

FIG. 9A and FIG. 9B show the condition in which processing in the element height direction has been performed. FIG. 23 is a plan view thereof. First of all, an element height defining resist pattern 8 is formed that defines the element height direction; after this, the track middle section (FIG. 9A) and track edges (FIG. 9B) are etched, using for example ion milling. At this point, the DLC that is used as the etching suppression layer 7 functions as an etching protective film for the domain control film 5. In this way, reduction in the thickness of the domain control film 5 can be prevented, thereby making it possible to suppress reduction in the volume of the domain control film 5 that accompanies increased fineness in the element height direction, making it possible to achieve stabilization of the performance of the domain control film 5.

Figure 10A:
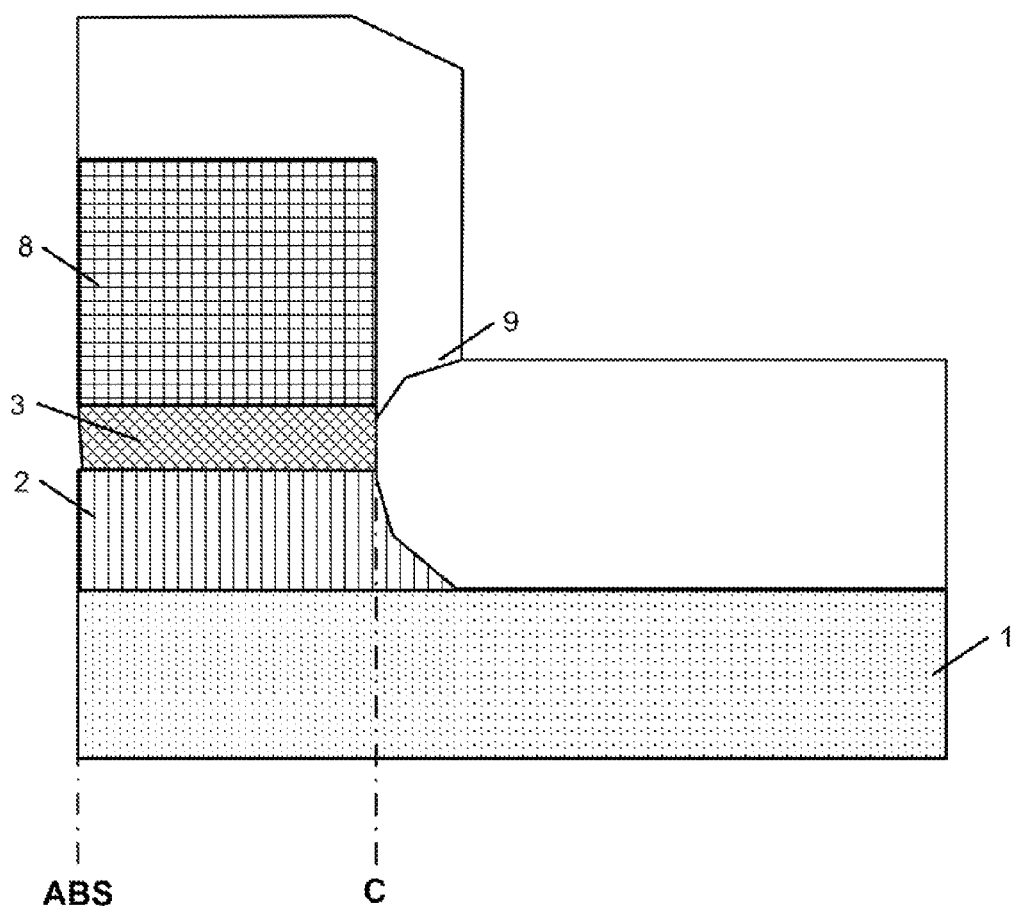
FIG. 10A is a cross-sectional view showing one step in the manufacture of a reproduction head, according to one embodiment.
Figure 10B:
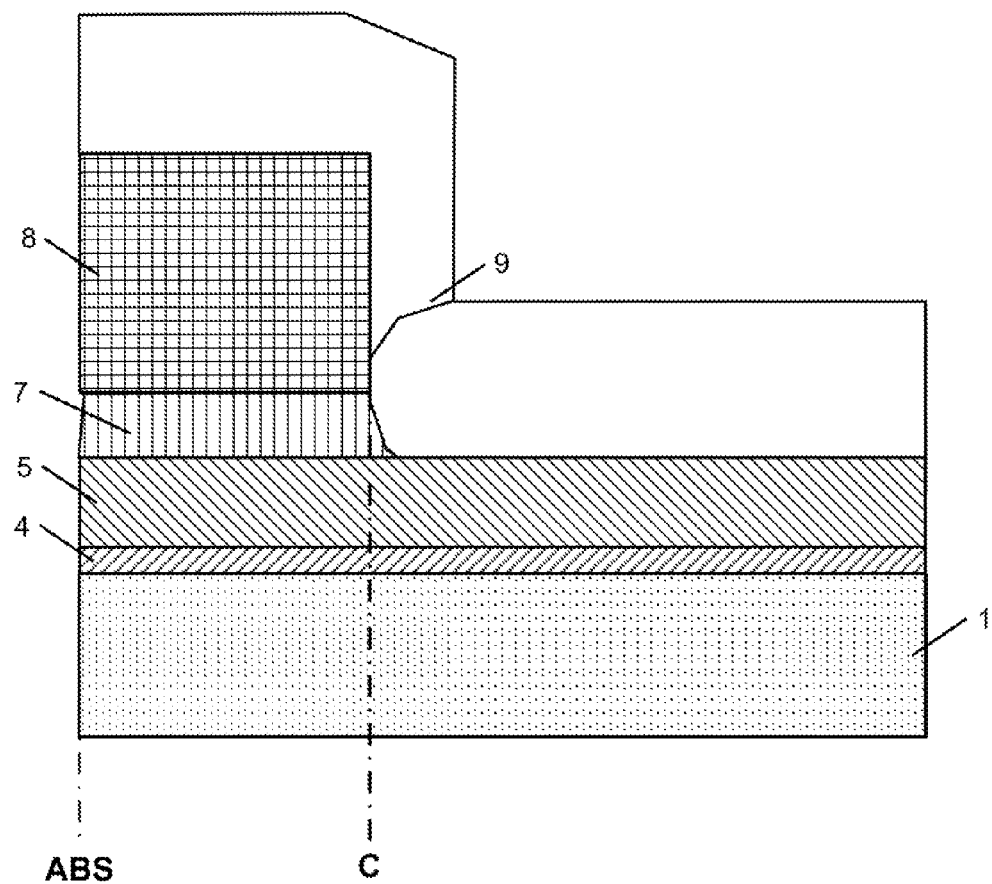
FIG. 10B is a cross-sectional view showing one step in the manufacture of a reproduction head, according to one embodiment.
Figure 24:
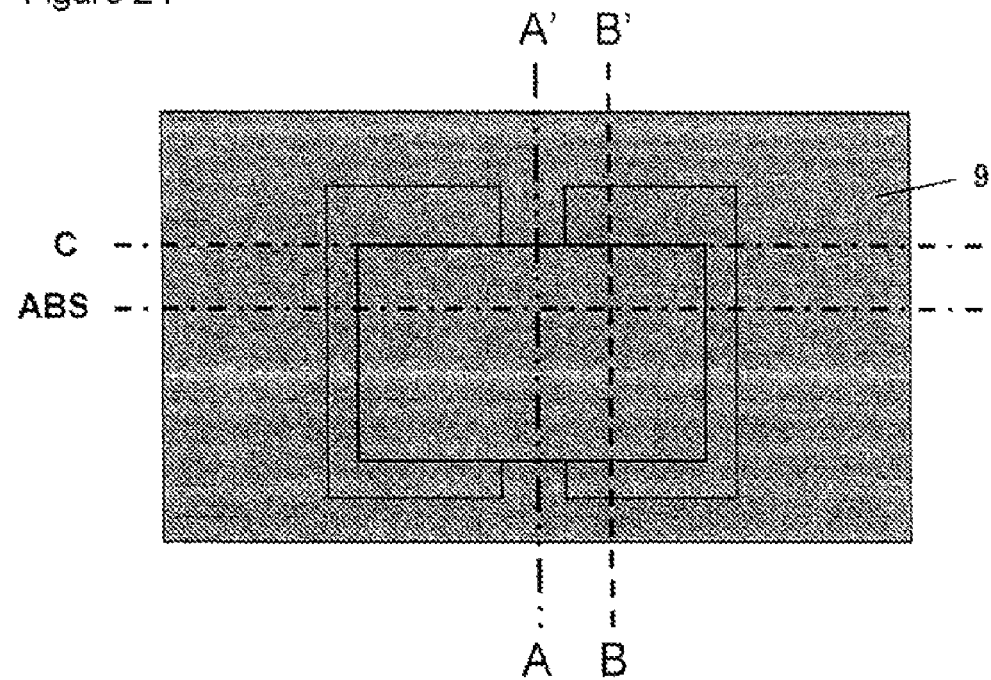
FIG. 24 is a plan view showing a step of manufacturing a reprothiction head, according to one embodiment.

FIG. 10A and FIG. 10B are views showing the condition in which the element height direction insulating film 9 is arranged at the etched edge in the element height direction. FIG. 24 shows a plan view at this point. A single-layer film of for example $Al_2O_3$, $SiO_2$ or AlN or laminated film may be employed as the insulating film 9 in the element height direction. In addition, an etching suppression layer as shown in FIG. 8B may be arranged on the insulating film 9 in the element height direction.

Figure 11A:
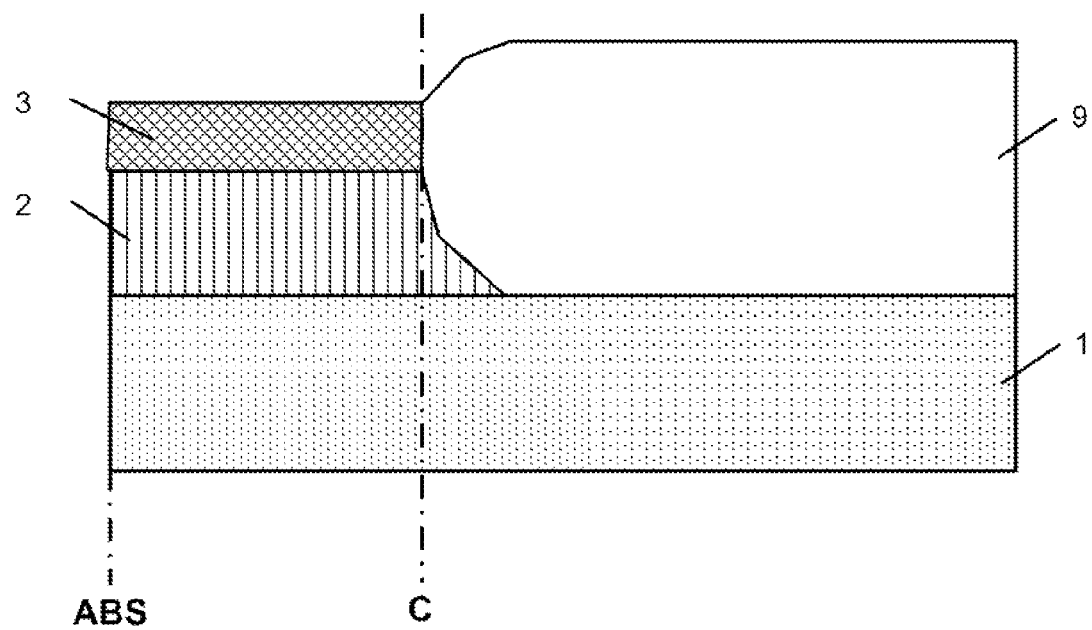
FIG. 11A is a cross-sectional view showing one step in the manufacture of a reproduction head, according to one embodiment.
Figure 11B:
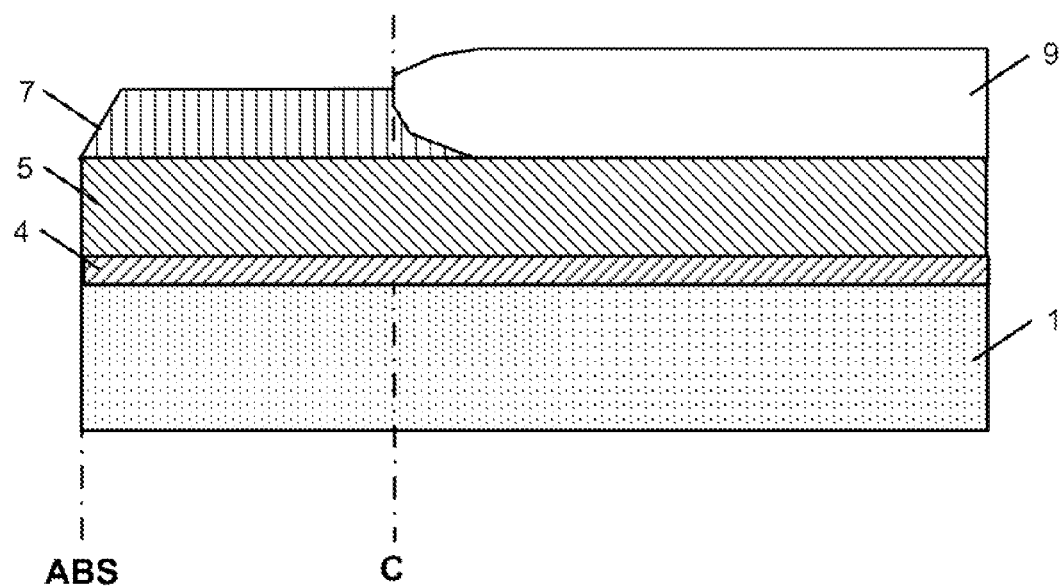
FIG. 11B is a cross-sectional view showing one step in the manufacture of a reproduction head, according to one embodiment.
Figure 25:
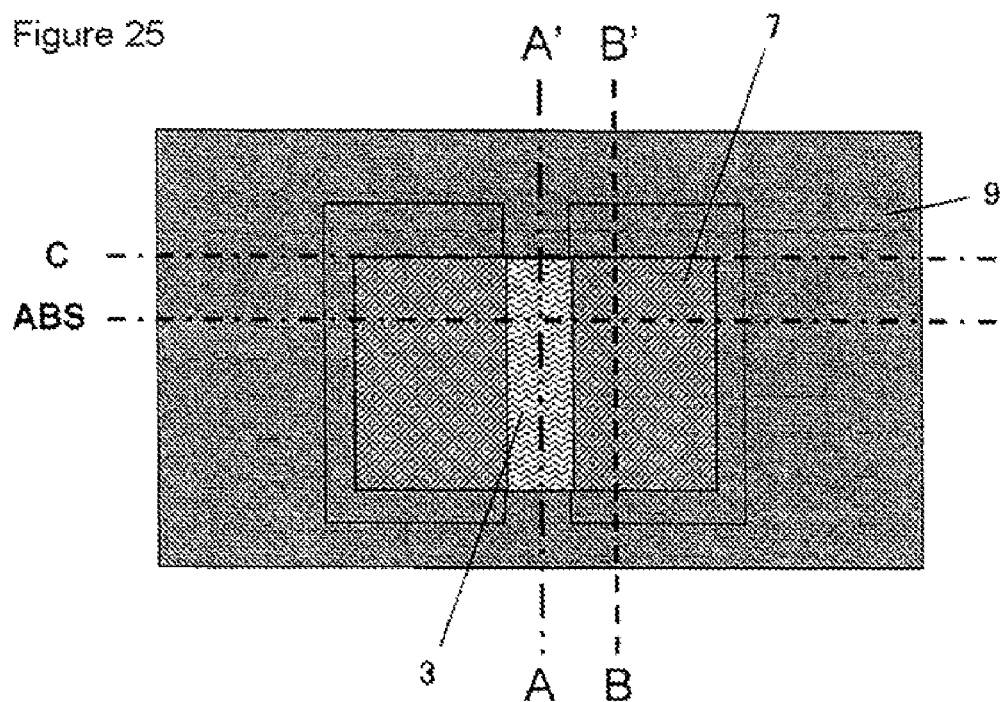
FIG. 25 is a plan view showing a step of manufacturing a reproduction head, according to one embodiment.

FIG. 11A and FIG. 11B show the condition when the insulating film 9 in the element height direction and the element height defining resist pattern 8 which are no longer required have been removed. FIG. 25 shows a plan view at this point. As the method for removing the insulating film 9 in the element height direction, general removal, i.e. the so-called lift-off process, may be performed, in which lifting-off is performed using a stripper, including the element height defining resist pattern 8. Also, for example, residue remaining in the form of a fence can be removed by using, for example, an etch-back process or CMP process, in which etching is performed after application of a flattening resin. By performing such processes, an insulating film 9 in the element height direction can be achieved with a film thickness that is smaller in the case of FIG. 11B than in the case of FIG. 11A. In this way, it becomes possible to reduce the difference of height from the upper surface of the lower magnetic shield to the upper surface of the element height direction insulating film 9 in the track middle (FIG. 11A) and the track edges (FIG. 11B). As a result, surface unevenness of the upper magnetic shield that is subsequently formed can be reduced and degradation of the shield performance can be prevented.

Figure 12A:
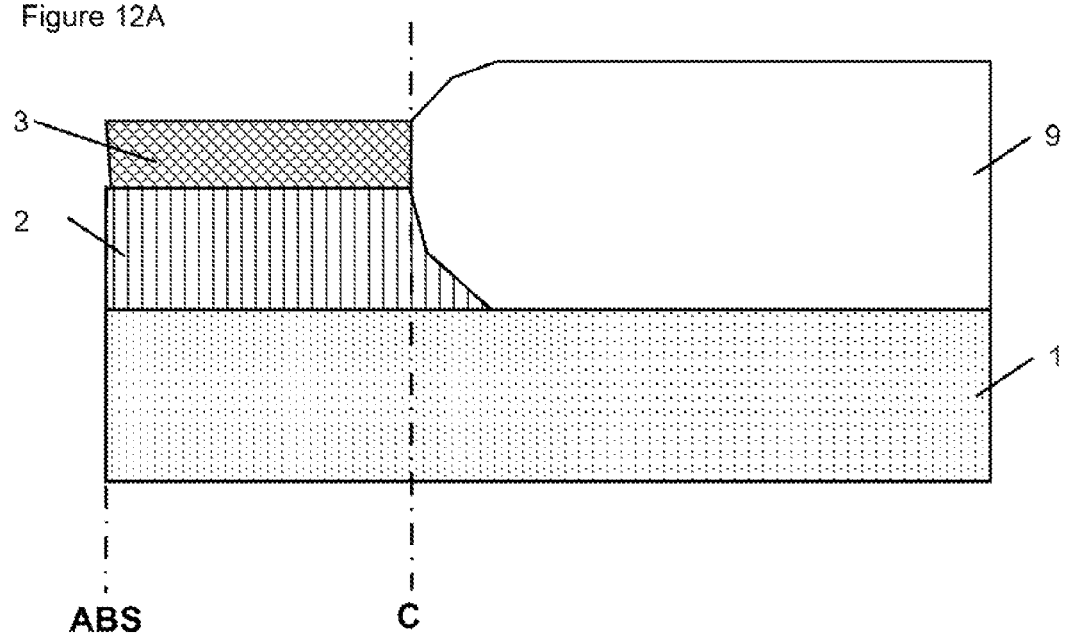
FIG. 12A is a cross-sectional view showing one step in the manufacture of a reproduction head, according to one embodiment.
Figure 12B:
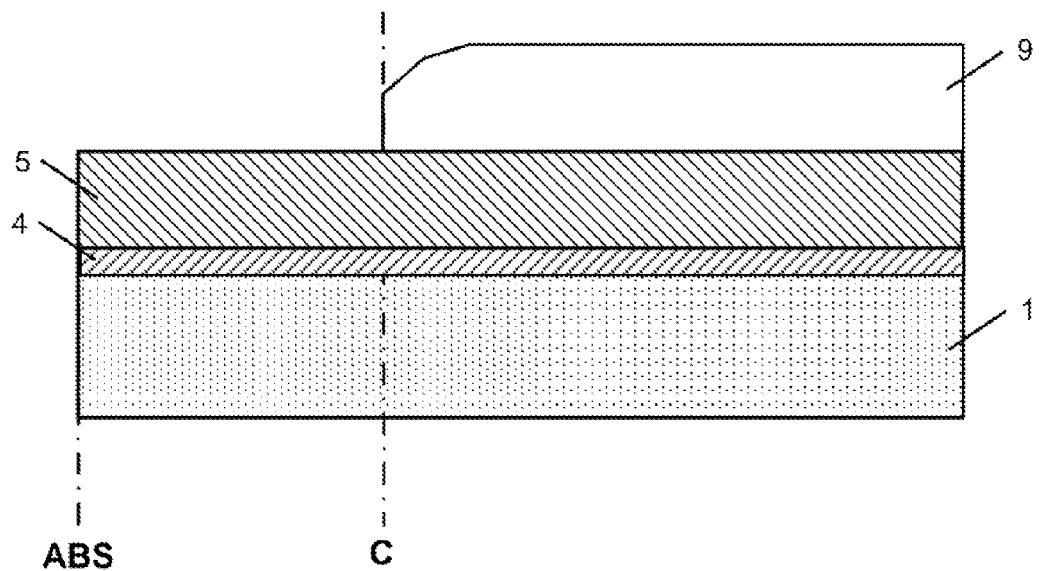
FIG. 12B is a cross-sectional view showing one step in the manufacture of a reproduction head, according to one embodiment.
Figure 26:
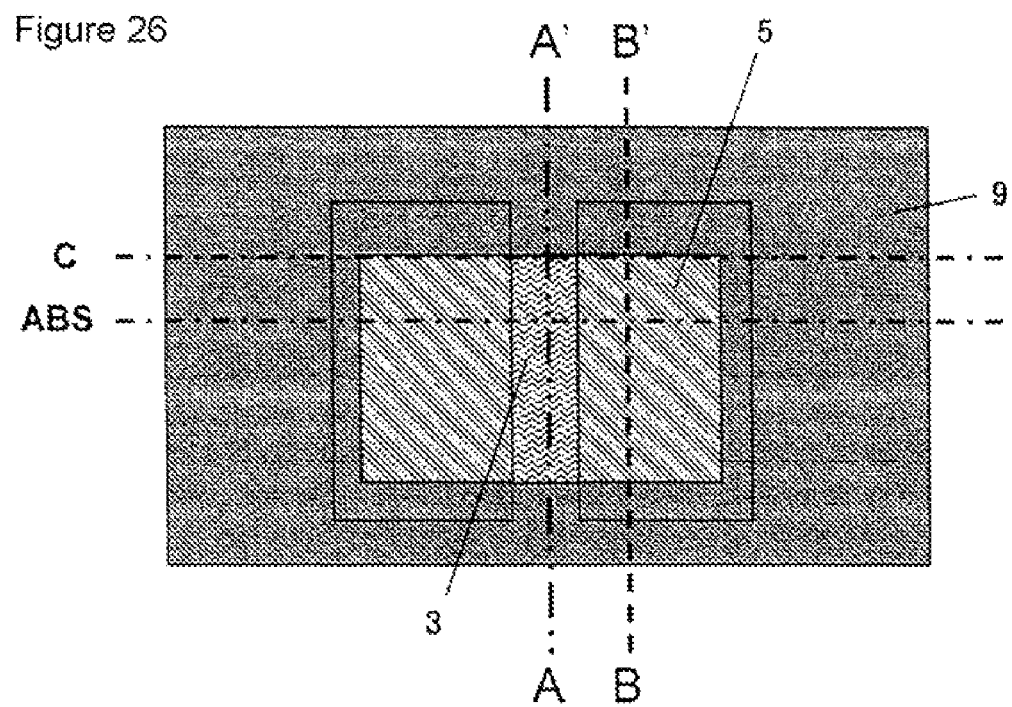
FIG. 26 is a plan view showing a step of manufacturing a reproduction head, according to one embodiment.

FIG. 12A and FIG. 12B show the condition after removal of the etching suppression layer 7 that was left on the domain control film 5. FIG. 26 shows a plan view at this point. The DLC used as an example of the etching suppression layer 7 in this case can easily be removed by, for example, ashing using an oxygen-based process.

Figure 13A:
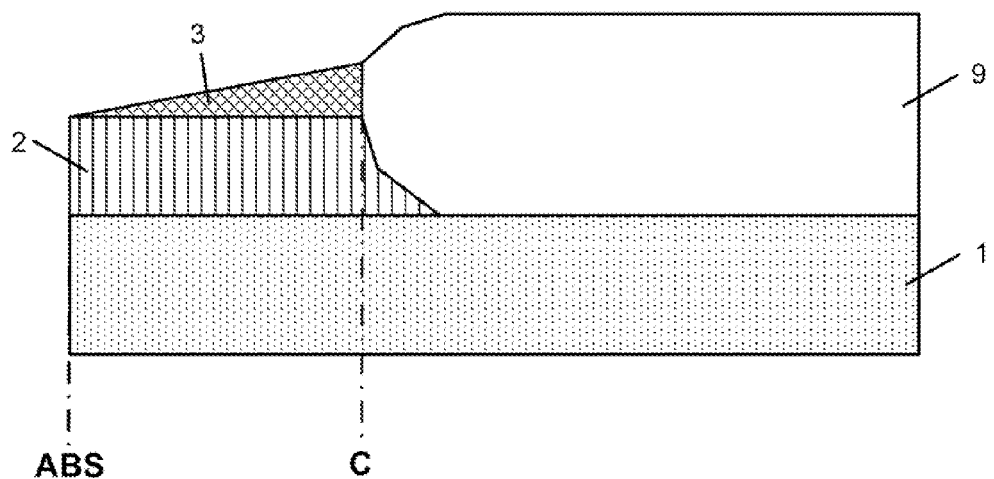
FIG. 13A is a cross-sectional view showing one step in the manufacture of a reproduction head, according to one embodiment.
Figure 13B:
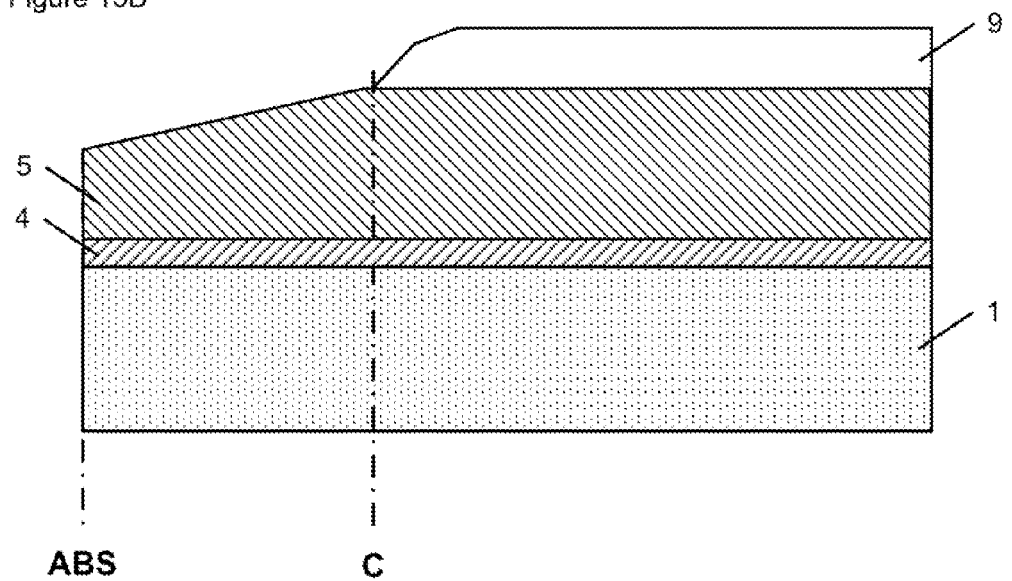
FIG. 13B is a cross-sectional view showing one step in the manufacture of a reproduction head, according to one embodiment.
Figure 27:
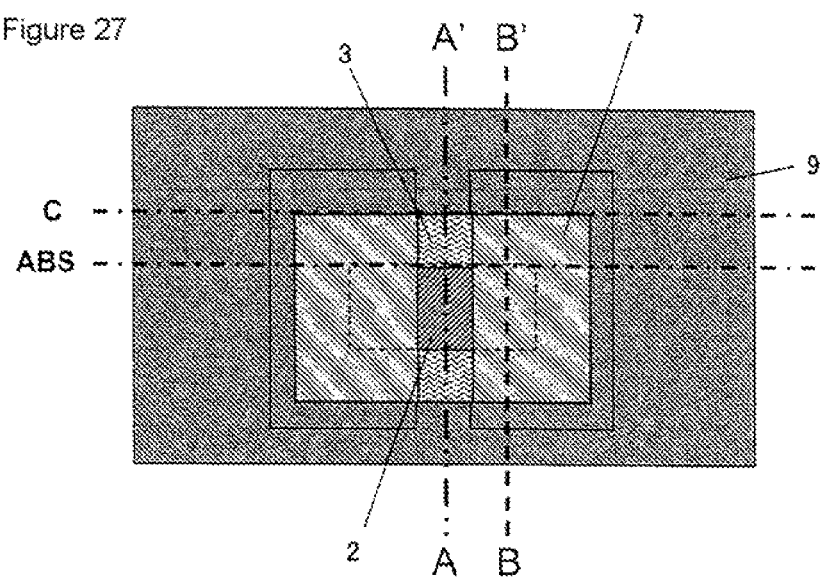
FIG. 27 is a plan view showing a step of manufacturing a reproduction head, according to one embodiment.

FIG. 13A and FIG. 13B show the etched condition of the sensor cap film 3 and the main control film 5, using the element height direction insulating film 9 as an etching mask. FIG. 27 shows a plan view at this point. The broken-line positions in FIG. 27 are inclined edges formed by etching. That is, the etching depth is substantially uniform within the region defined by the broken lines. In contrast, the region outside the broken lines has a film thickness gradient in which the film thickness of the sensor cap film 3 and the domain control film 5 becomes progressively greater, going outwards. Thus, since, in the case of an actual magnetic head, the region as far as the ABS region from below in FIG. 27 is removed, the cross-sectional structure from the ABS towards the C direction in A-A' cross-section and B-B' cross-section is as shown in FIG. 13A and FIG. 13B. Also, regarding the planar shape in FIG. 27, the sensor cap film 3 is visible above and below the sensor film 2; as this gradient etching process, an example is illustrated of the case in which the etching beam is applied from the direction of the entire 360° periphery by rotating the wafer with respect to the incident etching beam, as in the ordinary milling process. Depending on the case, it would also be possible to perform etching from a fixed direction, without performing 360° rotation. In this case, a gradient is produced in accordance with the direction of incidence and the planar shape is different from that of FIG. 27. Basically, however, the concept of making the cross-sectional structure in the A-A' cross-section and B-B'cross-section from the ABS towards the C direction as in FIG. 13A and FIG. 13B is the same.

Since, as described above, either of the sensor cap film 3 or domain control film 5 is used as an etching mask for etching the element height direction insulating film 9, the starting position of the film thickness gradient in the element height direction of the sensor cap film 3 and of the domain control film 5 is the same. In other words, the important point is that since what defines the dimension of the CPP type magnetoresistive effect head in the element height direction is the sensor film 2, self-alignment is achieved of the edge position of the sensor cap film 3 in the element height direction, going inwards, and the position at which the film thickness of the domain control film 5 starts to change. Likewise, self-alignment is achieved of the position of commencement of the film thickness gradient of the sensor cap film 3.

Also, endpoint detection of etching is important. This is because this construction is determined by the etching step. As an example of endpoint detection, the method is available of performing etching management by using an element contained in the upper surface of the sensor cap film 3 or sensor film 2 as an etching, monitoring element. Also; as another example, an element that is disposed in the region of the domain control film 5 could be employed as an etching monitoring element. When the domain control film 5 has a laminated structure constituted by alternating an under-layer film and hard magnetic film, the boundary between these may be monitored. Also, if a domain control cap film is arranged on top of the domain control film 5, an element contained in the domain control cap film may be employed as a monitoring element.

A slightly more detailed description of the graded etching referred to above will now be given. As one example, since the insulating film 9 in the element height direction is employed as an etching mask, graded etching control can be achieved by employing the film thickness of the insulating film 9 in the element height direction and the milling angle when etching. The film thickness of the insulating film 9 in the element height direction can also be reduced by arranging an etching-resistant layer on top of the insulating film 9 in the element height direction and increasing the etching selectivity ratio. In addition, it is possible to achieve further gradient control by controlling the milling endpoint with high precision. Detection of the milling endpoint is performed by employing for example SIMS (Secondary Ion microprobe Mass Spectrometry) for element detection as described above.

Next, FIG. 2A and FIG. 2B show the condition when the upper magnetic gap film 11 upper magnetic shield 12 are formed. Reflecting the film thickness gradient structure in the element height direction formed in the steps of FIG. 13A and FIG. 13B, the distance between the upper magnetic shield 12 and the lower magnetic shield 1 is small at the air-bearing surface and becomes larger going towards the C face (element interior). This distance between the upper and lower magnetic shields is also self-aligned, as defined by the C face, so the benefits of the structure according to the present invention can be obtained in a stable fashion.

Figure 14A:
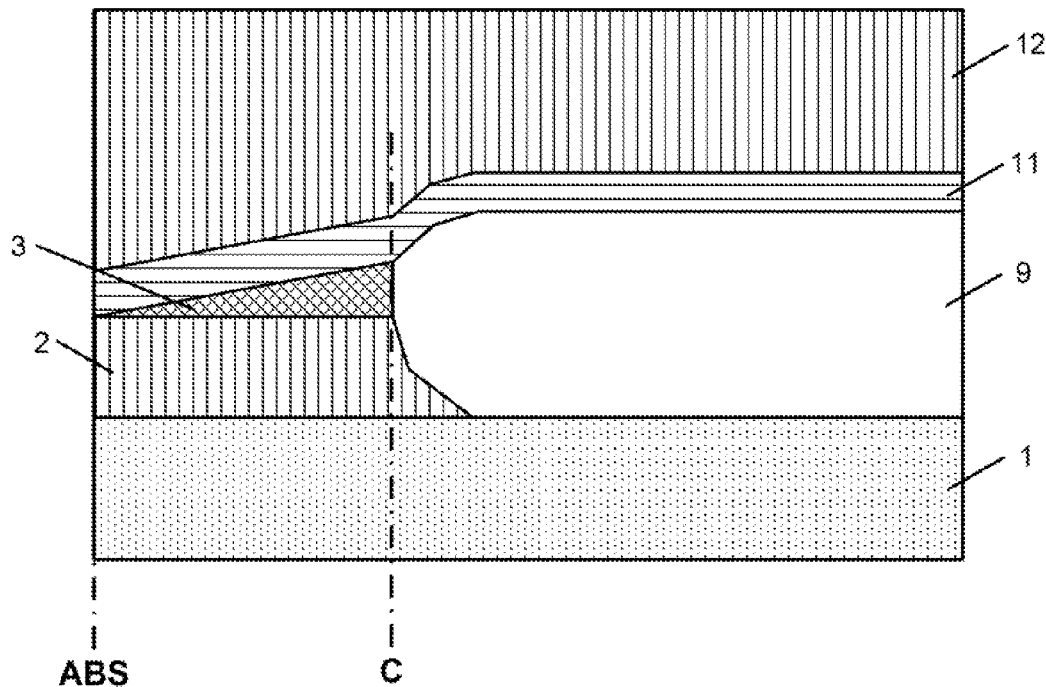
FIG. 14A is a cross-sectional view showing a reproduction head, according to one embodiment.
Figure 14B:
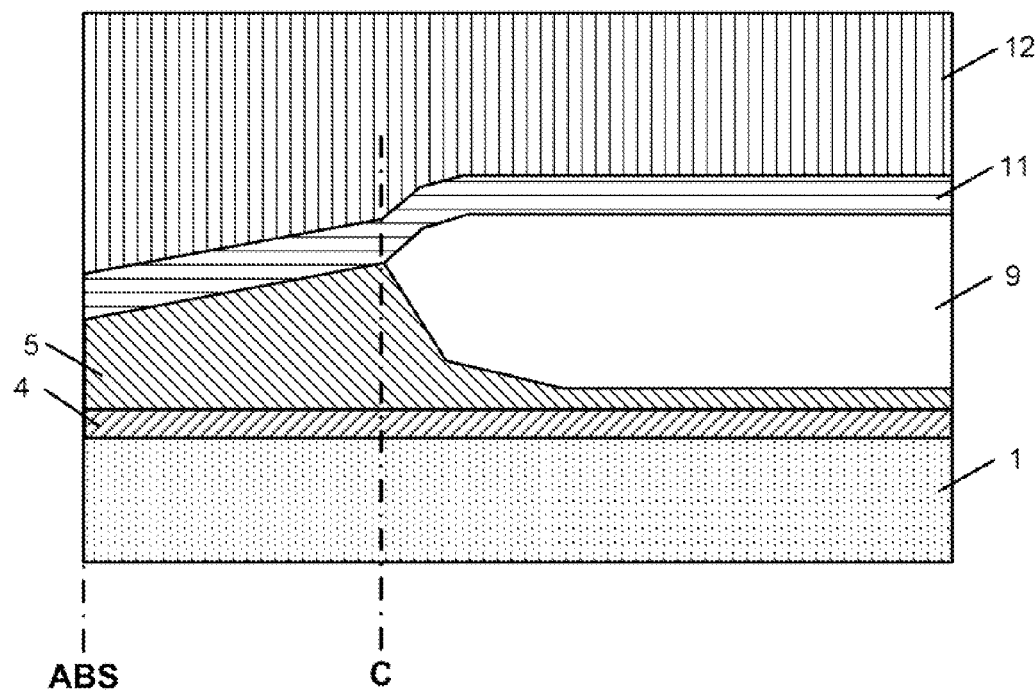
FIG. 14B is a cross-sectional view showing a reproduction head, according to one embodiment.

FIG. 14A and FIG. 14B are cross-sectional views of a magnetic head, according to one embodiment. The difference with regard to the embodiments shown in FIG. 2A and FIG. 2B lies in that the etching shape of the domain control film 5 is different. As can be seen by comparing FIG. 2B and FIG. 14B, in the present embodiment, the residual film thickness of the domain control film 5 decreases going towards the interior of the element, from the C face. The beneficial effect of the head structure of the present embodiment is that the step produced by etching of the track region (FIG. 14A) and the region outside the track (FIG. 14B) is small, so etching non-uniformity in the element height direction portion of the sensor film 2 is decreased, decreasing the risk of short-circuiting due to re-adhesion.

In the head structure of the practical embodiment shown in FIG. 14A and FIG. 14B, the domain control film 5 can also be obtained by etching together with the sensor film 2 in the step corresponding to FIG. 9A and FIG. 9B, by eliminating or reducing the film thickness of the etching suppression layer 7 shown for example in FIG. 8B and FIG. 22. Also, the construction, that is characteristic of the present invention, that the position of the edge of the insulating film 9 in the element height direction on the side of the air-bearing surface, the edge position of the sensor cap film 3, and the position where the film thickness of the domain control film 5 starts to change are all substantially the same as the C position shown in the figure, is also provided in this practical embodiment. That is, since what defines the dimension of the CPP type magnetoresistive head in the element height direction is the sensor film, the edge position of the sensor cap film 3 going inwards in the element height direction and the position where the film thickness of the domain control film 5 starts to change are self-aligned.

In other practical embodiments described below, the construction, that is characteristic of embodiments herein, that the edge position of the sensor cap film 3 going inwards in the element height direction, the position where the film thickness of the domain control film 5 starts to change and, in addition, the position where the distance between the upper lower magnetic shields in the sensor film region starts to change are self-aligned, is also provided, so the beneficial effect of this construction is also obtained.

Figure 15A:
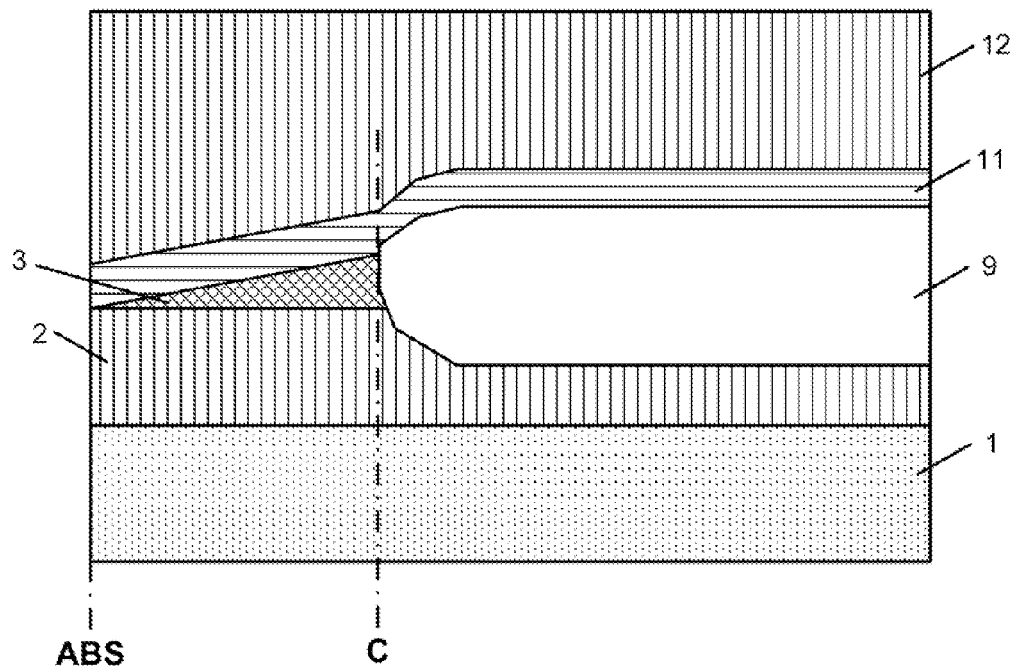
FIG. 15A is a cross-sectional view showing a reproduction head, according to one embodiment.
Figure 15B:
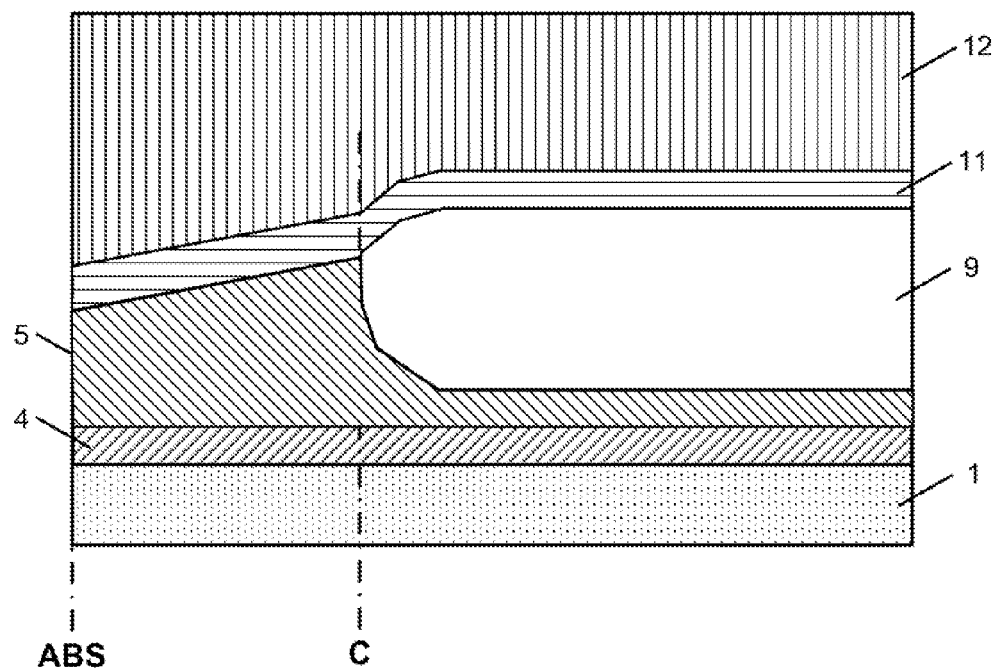
FIG. 15B is a cross-sectional view showing a reproduction head, according to one embodiment.
Figure 16:
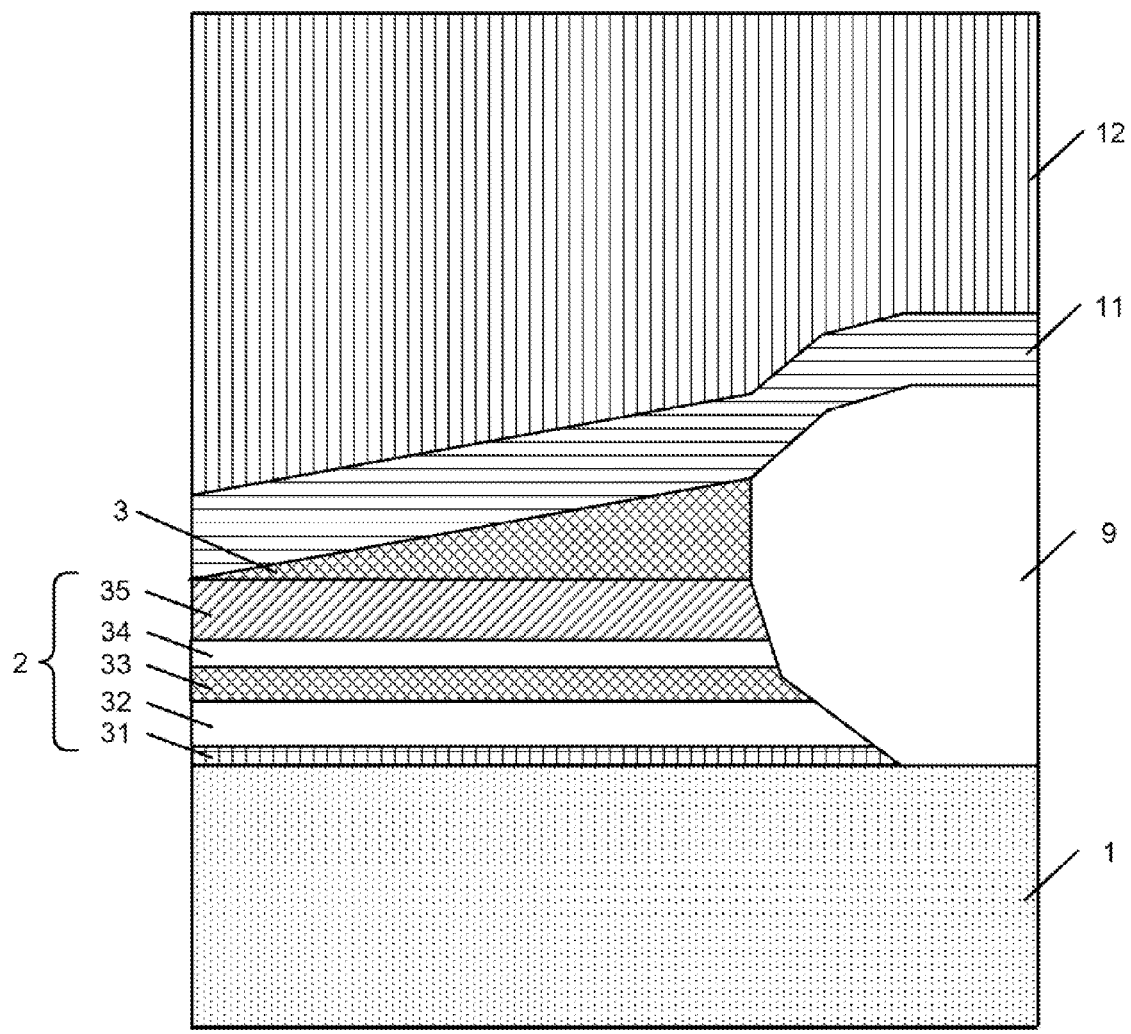
FIG. 16 is a view showing the shape of the cross-section in the vicinity of the sensor film, according to one embodiment.

FIG. 15A and FIG. 15B are cross-sectional views showing a further practical embodiment. The difference from the practical embodiment shown in FIG. 2A and FIG. 2B lies in that the etching shape of the sensor film 2 and the domain control film 5 is different. As shown in FIG. 15A, in the head structure of the present practical embodiment, the film thickness of the sensor film 2 is ensured on the side further towards the element interior than the C face. Specifically, at least as far as the vicinity of the free layer/intermediate layer within the sensor film 2 is removed, leaving the layer underneath this. FIG. 16 is a view to a larger scale of FIG. 15A; in the embodiment illustrated, etching is carried out as far as the free layer 35 and intermediate layer 34, leaving a fixed layer 33 and antiferromagnetic layer 32. Also, as can be seen by comparing FIG. 15B and FIG. 14B, a residual film thickness of the domain control film 5 from the C face towards the interior of the element can be better ensured with this practical embodiment than in the case of the practical embodiment shown in FIG. 14B. With this head structure, the step produced by etching of the track region (FIG. 15A) and the region outside the track (FIG. 15B) is smaller than in the case of the practical embodiment shown in FIG. 2A and FIG. 2B or the practical embodiment shown in FIG. 14A and FIG. 14B, so etching non-uniformity in the element height direction portion of the sensor film 2 may be decreased, further decreasing the risk of short-circuiting due to re-adhesion. Also, stabilization of properties can be achieved by the increase in volume and/or improvement in the shape anisotropic effect of for example the fixed layer or antiferromagnetic layer constituting the sensor film 2.

The head structure of the practical embodiment shown in FIG. 15A and FIG. 15B is obtained by eliminating or reducing the film thickness of the etching suppression layer 7 shown for example in FIG. 8B and FIG. 11 in the step of etching the sensor film 2 and the main control film 5 corresponding to FIG. 9A and FIG. 9B and etching these films as far as an intermediate position.

Figure 17A:
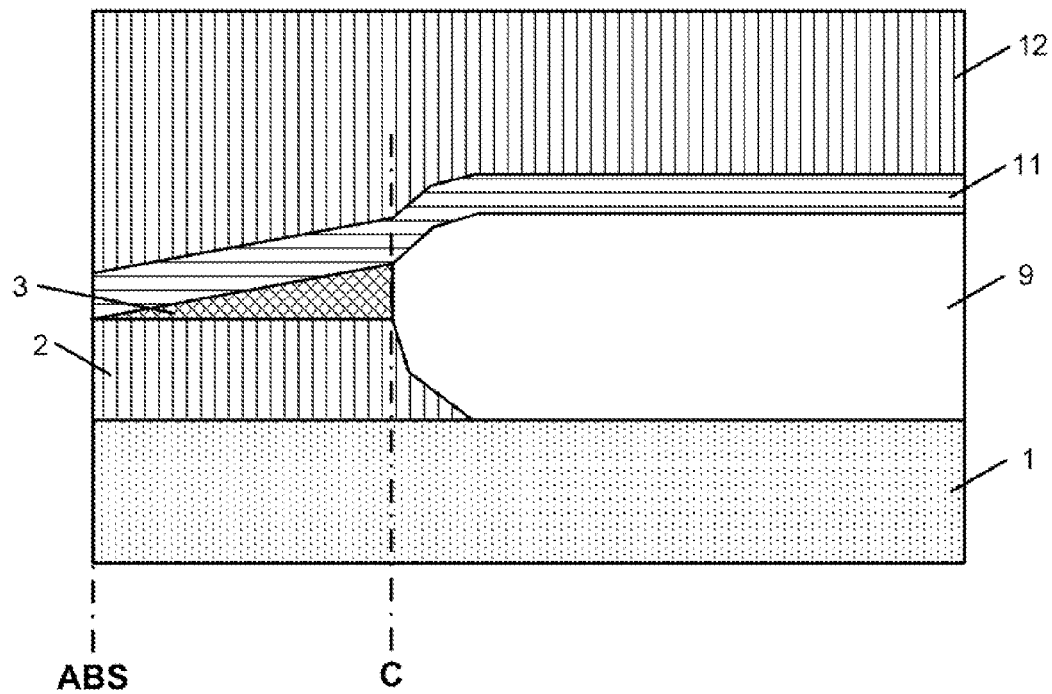
FIG. 17A is a cross-sectional view showing a reproduction head, according to one embodiment.
Figure 17B:
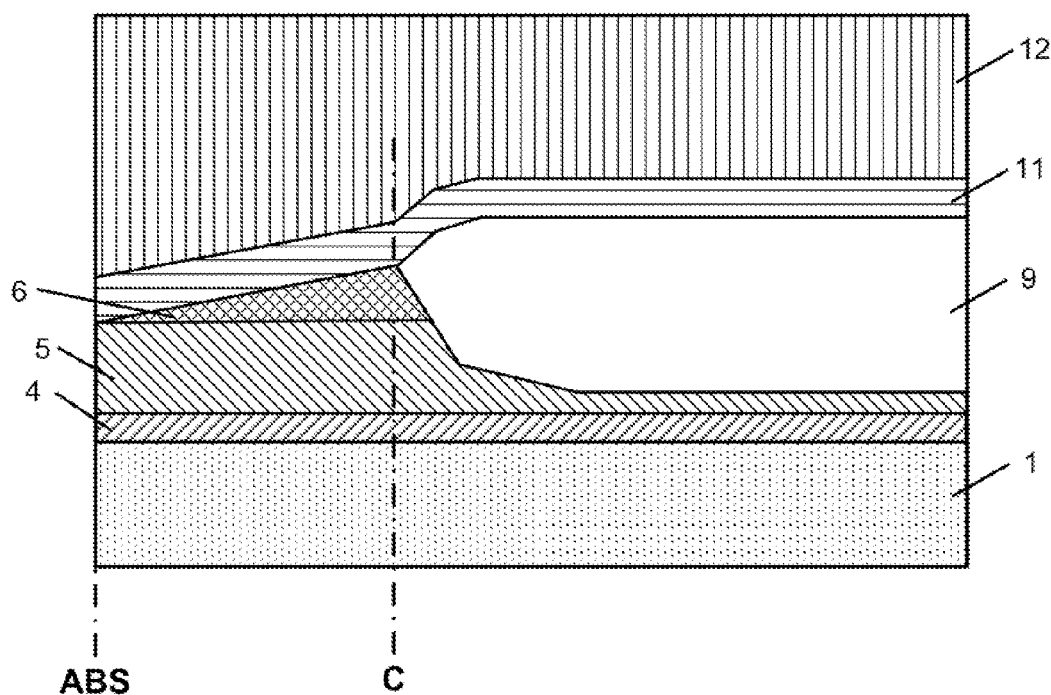
FIG. 17B is a cross-sectional view showing a reproduction head, according to one embodiment.

In the practical embodiment shown in FIG. 17A and FIG. 17B, a domain control cap film 6 is arranged on the domain control film 5 and this domain control cap film 6 is arranged so as to decrease in thickness towards the direction of the air-bearing surface. With the head construction of the present practical embodiment, the region of the domain control film 5 that is exposed to etching can be reduced, so etching damage of the domain control film 5 can be reduced. Also, etching is achieved with the same shape going towards the element interior from the C face to below the sensor film 2 or domain control film 5, in the case of both the track region (FIG. 17A) and the region outside the track (FIG. 17B). The advantage of this construction is that, just as in the case of the practical embodiment shown in FIG. 15A and FIG. 15B, etching non-uniformity in the portion of the sensor film 2 in the element height direction is decreased, making it possible to reduce the risk of short-circuiting caused by re-adhesion. Also, the reason why a gradient in the element height direction of the domain control magnetic field is added in the head construction of the present practical embodiment is that the distance between the upper magnetic shield 12 and the domain control film 5 is enlarged on the side of the element height direction interior (C), compared with the air-bearing surface (ABS) side. In this way, the extent of leakage of the domain control magnetic field from the domain control film 5 to the upper magnetic shield 12 is diminished more in the case of the direction going towards the interior in the element height direction, rather than in the direction going towards the air-bearing surface. As a result, the domain control magnetic field that is applied to the sensor film 2 can be progressively strengthened in the direction going towards the interior in the element height direction.

Figure 18A:
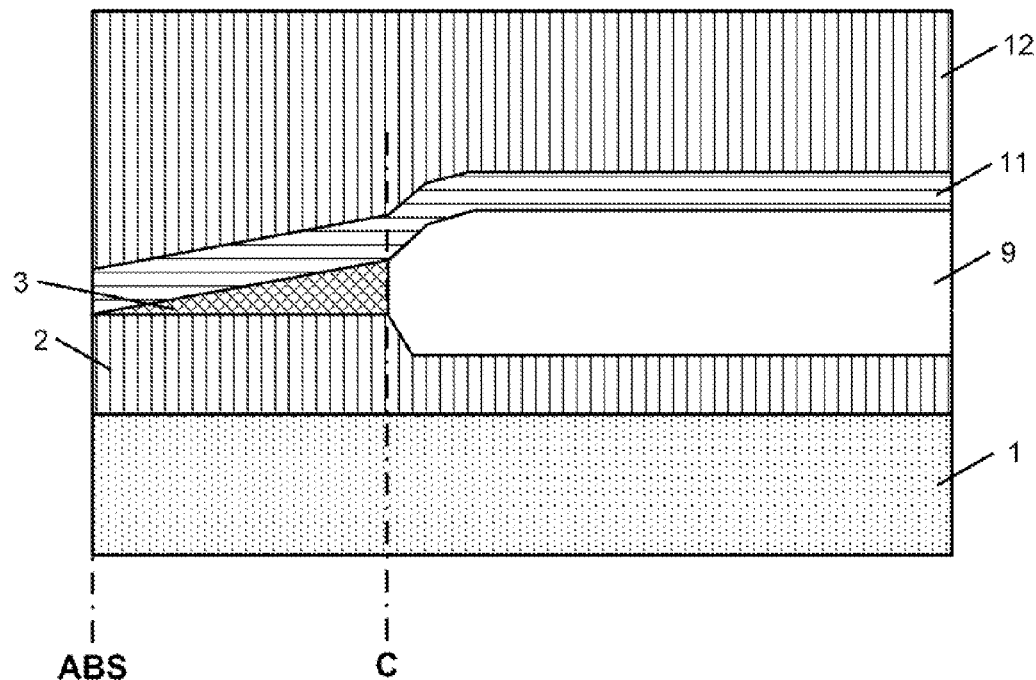
FIG. 18A is a cross-sectional view showing a reproduction head, according to one embodiment.
Figure 18B:
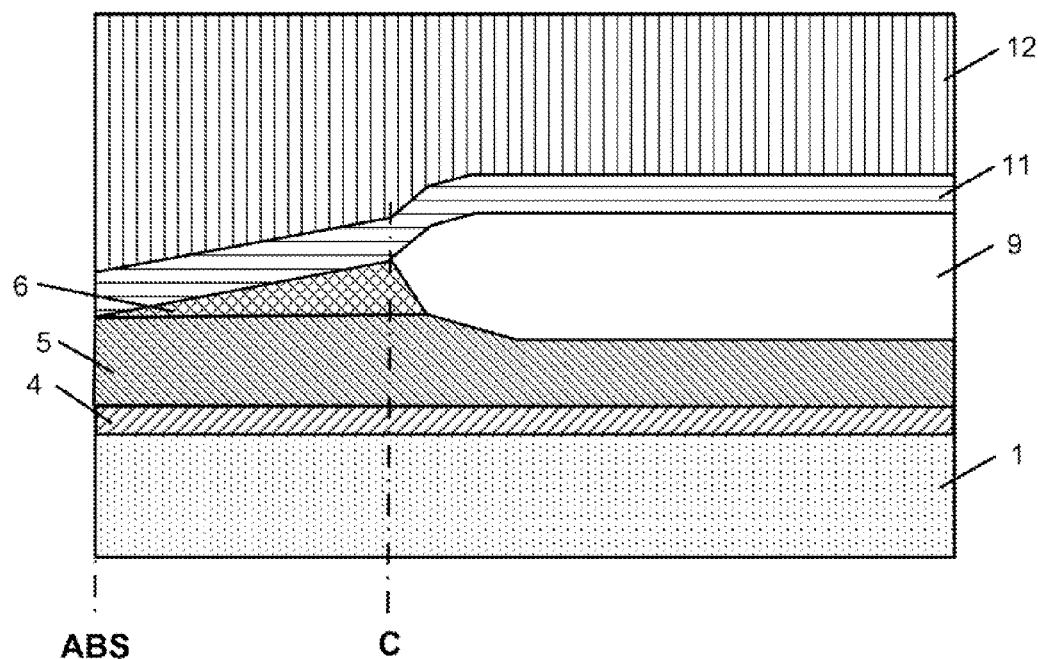
FIG. 18B is a cross-sectional view showing a reproduction head, according to one embodiment.

FIG. 18A and FIG. 18B are cross-sectional views showing a further practical embodiment. In the case of the head construction of this practical embodiment, the risk of element short-circuiting is further reduced by reducing the amount of etching of for example the sensor film 2 or domain control film 5 and etching damage of the domain control film 5 can be reduced by adding a domain control cap film 6. Also, just as in the case of the practical embodiment shown in FIG. 17A and FIG. 17B, the reason why a gradient in the element height direction of the domain control magnetic field is added in the head construction of the present practical embodiment is that the distance between the upper magnetic shield 12 and the domain control film 5 is enlarged on the side of the element height direction interior (C), compared with the air-bearing surface (ABS) side.

Figure 19A:
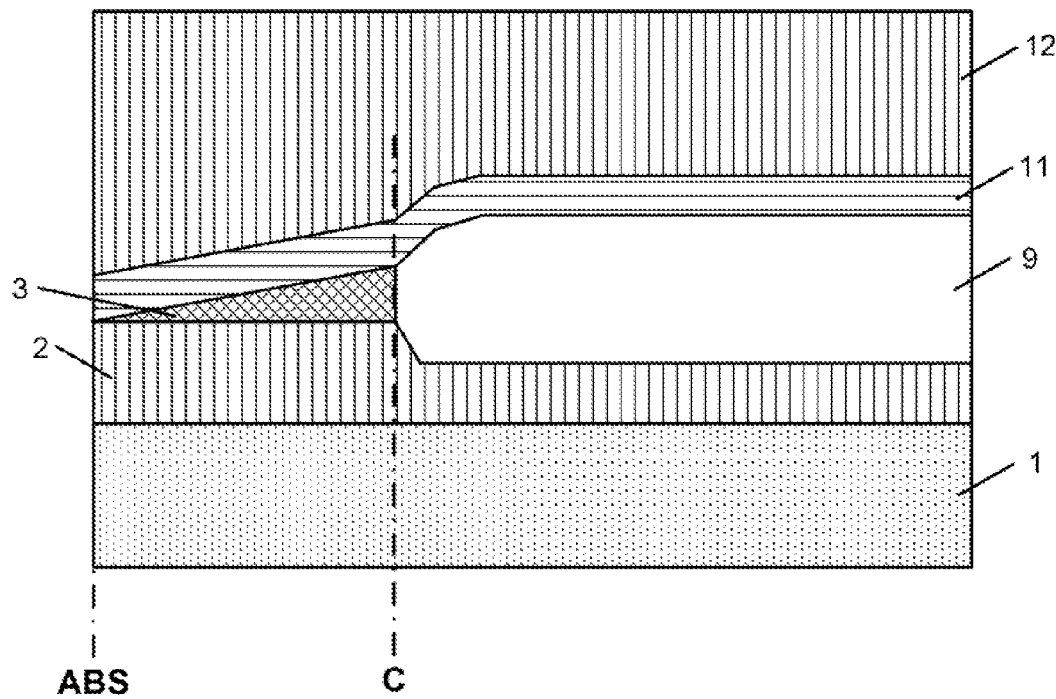
FIG. 19A is a cross-sectional view showing a reproduction head, according to one embodiment.
Figure 19B:
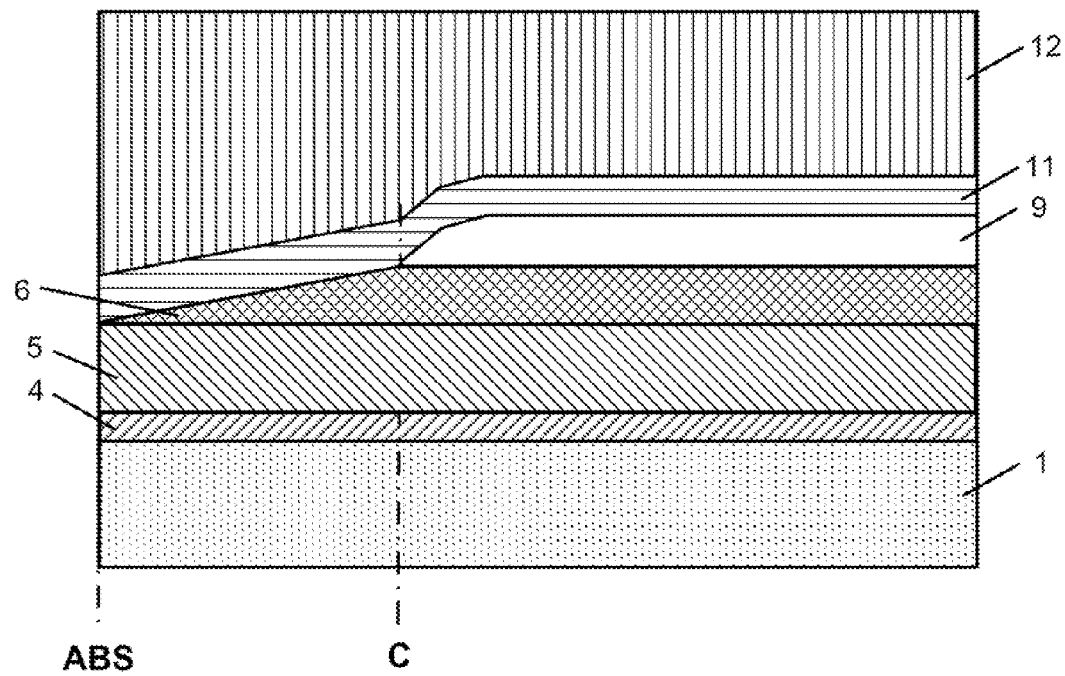
FIG. 19B is a cross-sectional view showing a reproduction head, according to one embodiment.

FIG. 19A and FIG. 19B are cross-sectional views showing a further practical embodiment. In this practical embodiment, the risk of element short-circuiting is further reduced by reducing the amount of etching of the sensor film 2 and etching damage of the domain control film 5 can be reduced by adding a domain control cap film 6. In the manufacturing step of the present practical embodiment, a domain control cap film 6 is formed on the domain control film 5, and an etching suppression layer is formed thereon as shown in FIG. 8B and FIG. 22. Also, the reason why a gradient in the element height direction of the domain control magnetic field is added in the head construction of the present practical embodiment is that the distance between the upper magnetic shield 12 and the domain control film 5 is enlarged on the side of the element height direction interior (C), compared with the air-bearing surface (ABS) side, just as in the case of the practical embodiment shown in FIG. 17A and FIG. 17B. Also, the domain control film 5 is also held on the side further inwards in the element height direction (C), so the domain control magnetic field on the side of the element height direction (C) can be further strengthened.

Figure 20A:
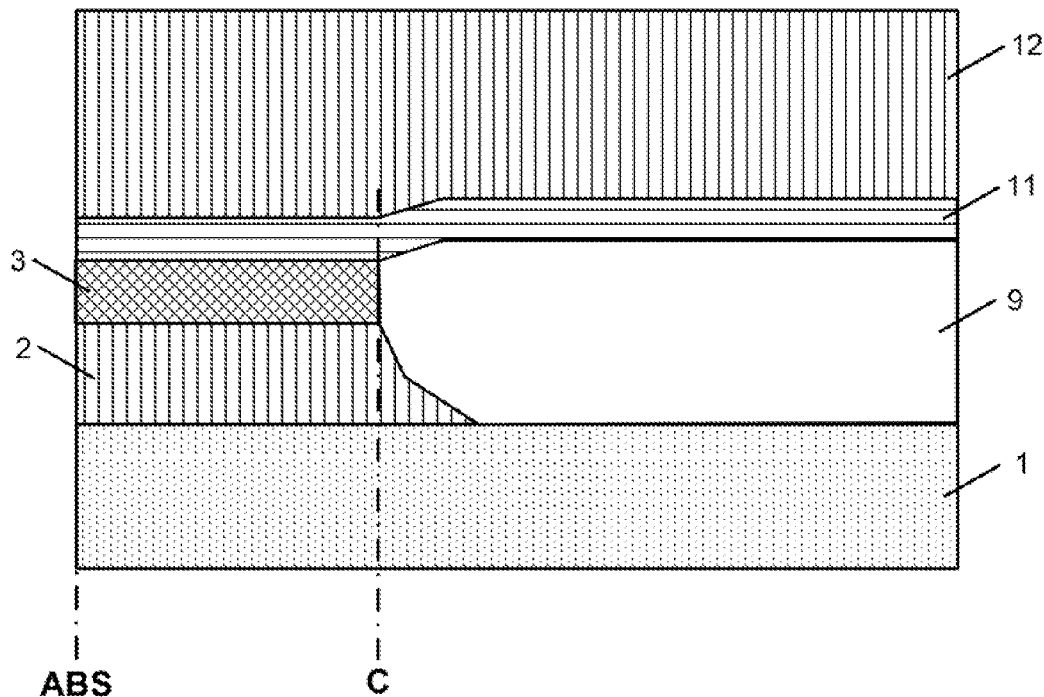
FIG. 20A is a cross-sectional view showing a reproduction head, according to one embodiment.
Figure 20B:
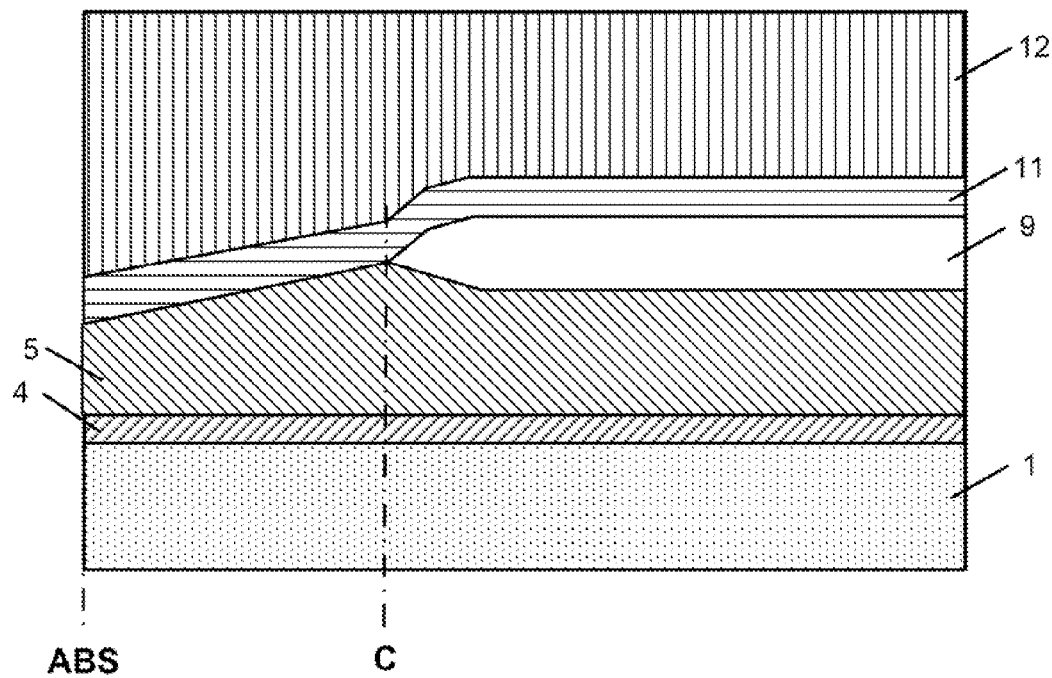
FIG. 20B is a cross-sectional view showing a reproduction head, according to one embodiment.

The practical embodiment shown in FIG. 20A and FIG. 20B is a modification of the practical embodiment shown in FIG. 2A and FIG. 2B, having a construction in which the film thickness of the sensor cap film 3 is substantially fixed from the air-bearing surface to the position of the C face. The head construction of this practical embodiment is a construction in which the film thickness of the domain control film 5 diminishes as the air-bearing surface is approached from the C face. Thus the beneficial effect of embodiments described herein is obtained. The advantage of this construction is that no reduction in film thickness in respect of the sensor cap film 3 takes place in the vicinity of the air-bearing surface, so the extent of etching damage to the sensor film 2 itself can be reduced. This beneficial effect is particularly outstanding in the case of a laminated construction of the sensor film 2, in which the free layer is arranged on the side of the upper magnetic field.

An example of a method of manufacture to achieve this is a method in which, when graded etching is performed, a further film (sacrificial layer) is arranged on top of the sensor cap film 3 and this film (sacrificial layer) is subsequently removed by selective etching without this graded etching affecting the sensor cap film 3, according to one embodiment. As an example, if the sensor cap film 3 is constituted of for example Cr, Rh, Ru, Cu or Ir, the sacrificial layer may be constituted by for example Ta, Nb, W, Ti, Si or an oxide film of these. Damage to the sensor cap film 3 during the graded etching is absorbed by this sacrificial layer, and this sacrificial layer may finally be removed by for example RIE (Reactive Ion Etching) using a fluorine-based system. DLC or Ru etc may also be employed as other examples of the sacrificial layer. In this case, final removal can be achieved by for example RIE using an oxygen-based system.

While various practical embodiments have been illustrated above, a construction combining more than one of these practical embodiments could also be employed. As an example, the construction of FIG. 17A and the construction of FIG. 2B could be combined. Also, as the shape on the side going towards the interior of the element from the C face, the amount of etching of the track region and/or region outside the track in the lower magnetic shield direction can be set at will; although not shown, an excavated construction could be adopted by over-etching the lower magnetic shield.

FIG. 28 is a diagram showing an embodiment of the construction of a magnetic head of the type in which the portion for perpendicular recording and the portion for recording reproduction are separated. The magnetic head 200, according to one embodiment, comprises a reproduction head 60 and a recording head 50. The recording head 50 is a head adapted for perpendicular recording and comprises a lower pole 51, coil 52, coil insulating film 53 and main pole 54. A recording head for longitudinal recording could also be used as the recording head. The reproduction head 60 is a reproduction head, according to one embodiment, as described in detail in the practical embodiments up to this point. Only the lower magnetic shield 1, the sensor film 2 and the magnetic shield 12 are shown in the drawings. The magnetic head, according to one embodiment, has the benefits described up to this point, and is a thin film magnetic head in which lowering of the reproduction output even in the case of narrow track width is prevented, magnetic noise is reduced and in which an improvement in the head SNR can be achieved.

Figure 29:
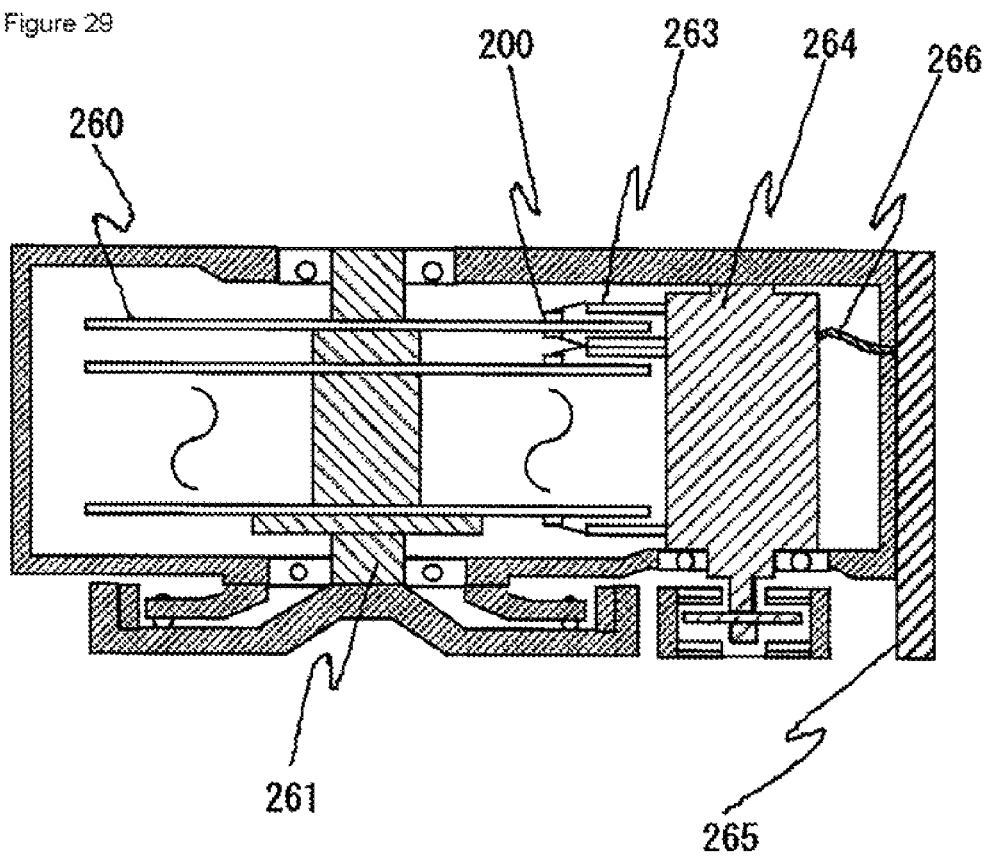
FIG. 29 is a diagram of a magnetic recording/reproduction device, according to one embodiment.

FIG. 29 is a cross-sectional diagram of a magnetic recording/reproduction device including a magnetic head, according to one embodiment. This magnetic/recording reproduction device comprises: a magnetic disk 260, a spindle 261 that drives the magnetic disk in rotation, a gimbal 263 provided with a magnetic head 200, according to one embodiment shown in FIG. 28 at its tip, a voice coil motor 264 for determining the position of the magnetic head 200 in the desired track position of the magnetic disk 260, wiring 266, and a signal processing circuit 256. By providing a magnetic head incorporating a reproduction head, according to one embodiment, in a magnetic recording/reproduction device, an improvement in the head SNR compared with conventionally can be achieved and higher recording density can be achieved.

The present invention may be used in magnetic sensors and magnetic heads that make use of the perpendicular current type magnetoresistive effect, according to various embodiments.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic head comprising:
a sensor film, comprising:
   a fixed layer whose magnetization direction is fixed;
   an intermediate layer; and
   a free layer having a magnetization direction that changes in response to an external magnetic field;
a sensor cap film above the sensor film;
a pair of shields including an upper magnetic shield and a lower magnetic shield which serve as electrodes that pass current in a film thickness direction of the sensor film;
a track insulating film contacting both sides of the sensor film in the track width direction;
a domain control film arranged on both sides in the track width direction of the sensor film adjacent the track insulating film; and
an element height direction insulating film positioned on an opposite side of the sensor film relative to an air-bearing surface,
wherein an edge position of the element height direction insulating film adjacent the sensor film on the air-bearing surface side is substantially the same as an edge position of the sensor cap film in the element height direction,
wherein the domain control film is graded such that a film thickness of the domain control film progressively decreases from an inner side in the element height direction toward the air-bearing surface direction, and
wherein a position at which the film thickness of the domain control film starts to change is substantially the same as the edge position of the element height direction insulating film on the air-bearing surface side thereof.

2. The magnetic head as recited in claim 1, wherein a separation between the lower magnetic shield and the upper magnetic shield is wider in a region more remote from the air-bearing surface than in a region closer to the air-bearing surface.

3. The magnetic head as recited in claim 2, wherein the film thickness of the sensor cap film is thicker in a position more remote from the air-bearing surface than in a position closer to the air-bearing surface.

4. The magnetic head as recited in claim 3, wherein a separation between the lower magnetic shield and the upper magnetic shield is wider in a region more remote from the air-bearing surface than in a region closer to the air-bearing surface.

5. The magnetic head as recited in claim 1, further comprising a recording head.

6. A magnetic data storage system, comprising:
at least one magnetic head as recited in claim 1;
a magnetic medium;
a drive mechanism for passing the magnetic medium over the at least one magnetic head; and
a controller electrically coupled to the at least one magnetic head for controlling operation of the at least one magnetic head.

7. A magnetic head comprising:
a sensor film, comprising:
   a fixed layer whose magnetization direction is fixed;
   an intermediate layer; and
   a free layer having a magnetization direction that changes in response to an external magnetic field;
a sensor cap film above the sensor film;
a pair of shields including an upper magnetic shield and a lower magnetic shield which serve as electrodes that pass current in a film thickness direction of the sensor film;
a track insulating film adjacent both sides of the sensor film in the track width direction;
a domain control film arranged on both sides in the track width direction of the sensor film adjacent the track insulating film;
a domain control cap film above the domain control film; and
an element height direction insulating film arranged in a portion on an opposite side to an air-bearing surface of the sensor film,
wherein an edge position of the element height direction insulating film adjacent the sensor film on the air-bearing surface side is substantially the same as an edge position of the sensor cap film in the element height direction,
wherein the domain control cap film is graded such that a film thickness of the domain control cap film progressively decreases from an inner side in the element height direction toward the air-bearing surface direction, and
wherein a position at which the film thickness of the domain control cap film starts to change or an edge position of the domain control cap film in the element height direction is substantially the same as the edge position of the element height direction insulating film on the air-bearing surface side.

8. The magnetic head as recited in claim 7, wherein a separation between the lower magnetic shield and the upper magnetic shield is wider in a region more remote from the air-bearing surface than in a region closer to the air-bearing surface.

9. The magnetic head as recited in claim 8, wherein the film thickness of the sensor cap film is thicker in a position more remote from the air-bearing surface than in a position closer to the air-bearing surface.

10. The magnetic head as recited in claim 9, wherein a separation between the lower magnetic shield and the upper magnetic shield is wider in a region more remote from the air-bearing surface than in a region closer to the air-bearing surface.

11. The magnetic head as recited in claim 7, further comprising a recording head.

12. A magnetic data storage system, comprising:
at least one magnetic head as recited in claim 7;
a magnetic medium;
a drive mechanism for passing the magnetic medium over the at least one magnetic head; and
a controller electrically coupled to the at least one magnetic head for controlling operation of the at least one magnetic head.

13. A method of manufacturing a magnetic head, the method comprising:
laminating and forming a sensor film, the sensor film comprising:
a fixed layer whose magnetization direction is fixed;
an intermediate layer; and
a free layer having a magnetization direction that changes in response to an external magnetic field;
laminating and forming a sensor cap film above the sensor film;
etching the sensor film and the sensor cap film to leave a desired width in a track width direction;
forming a track insulating film at an etching edge of the sensor film and the sensor cap film;
forming a domain control film above the track insulating film;
etching the sensor film to a dimension in an element height direction;
arranging an element height direction insulating film at the etching edge of the sensor film in the element height direction;
graded etching a top of the domain control film using the element height direction insulating film as an etching mask; and
forming an upper magnetic shield.

14. The method of manufacturing a magnetic head as recited in claim 13, further comprising forming a domain control cap layer above the domain control film and wherein graded etching of the top of the domain control film comprises graded etching of the domain control cap layer.

15. The method of manufacturing a magnetic head as recited in claim 14, further comprising forming an etching suppression film above the domain control cap film and wherein the etching of the sensor film to the dimension in the element height direction comprises suppressing etching of the domain control film.

16. The method of manufacturing a magnetic head as recited in claim 13, further comprising forming an etching suppression film above the domain control film and wherein the etching of the sensor film to the dimension in the element height direction comprises suppressing etching of the domain control film.

17. The method of manufacturing a magnetic head as recited in claim 13, wherein the graded etching of the top of the domain control film comprises simultaneously graded etching of the sensor cap film.

18. The method of manufacturing a magnetic head as recited in claim 17, further comprising forming a domain control cap layer above the domain control film and wherein graded etching of the top of the domain control film comprises graded etching of the domain control cap layer.

19. The method of manufacturing a magnetic head as recited in claim 18, further comprising forming an etching suppression film above the domain control cap film and wherein the etching of the sensor film to the dimension in the element height direction comprises suppressing etching of the domain control film.

20. The method of manufacturing a magnetic head as recited in claim 17, further comprising forming an etching suppression film above the domain control film and wherein the etching of the sensor film to the dimension in the element height direction comprises suppressing etching of the domain control film.

* * * * *

UNITED STATES PATENT AND TRADEMARK OFFICE
CERTIFICATE OF CORRECTION

PATENT NO. : 8,284,527 B2
APPLICATION NO. : 12/957229
DATED : October 9, 2012
INVENTOR(S) : Nobuo Yoshida et al.

It is certified that error appears in the above-identified patent and that said Letters Patent is hereby corrected as shown below:

In the specification:

col. 1, line 32, replace "(CIA)" with --(CIP)--;

col. 5, line 58, replace "reprothiction" with --reproduction--;

col. 9, line 12, replace "28" with --2B--.

Signed and Sealed this
Twelfth Day of February, 2013

Teresa Stanek Rea
*Acting Director of the United States Patent and Trademark Office*